US009714349B2

(12) United States Patent
Togawa et al.

(10) Patent No.: US 9,714,349 B2
(45) Date of Patent: Jul. 25, 2017

(54) HYDROLYSIS-RESISTANT POLYESTER FILM

(75) Inventors: Keiichiro Togawa, Otsu (JP); Hideto Ohashi, Tsuruga (JP); Toshifumi Unrinin, Otsu (JP); Hiroshi Shibano, Osaka (JP)

(73) Assignee: Toyobo Co., Ltd., Osaka (JP)

( * ) Notice: Subject to any disclaimer, the term of this patent is extended or adjusted under 35 U.S.C. 154(b) by 102 days.

(21) Appl. No.: 13/817,690

(22) PCT Filed: Aug. 17, 2011

(86) PCT No.: PCT/JP2011/068627
§ 371 (c)(1),
(2), (4) Date: Feb. 19, 2013

(87) PCT Pub. No.: WO2012/023571
PCT Pub. Date: Feb. 23, 2012

(65) Prior Publication Data
US 2013/0139883 A1    Jun. 6, 2013

(30) Foreign Application Priority Data

Aug. 18, 2010 (JP) .................................. 2010-182898
Mar. 8, 2011 (JP) .................................. 2011-049962

(51) Int. Cl.
| C09D 5/00 | (2006.01) |
| H01L 31/0216 | (2014.01) |
| C08J 5/18 | (2006.01) |
| H01L 31/048 | (2014.01) |
| H01L 31/049 | (2014.01) |
| C08K 5/13 | (2006.01) |

(52) U.S. Cl.
CPC ........ *C09D 5/00* (2013.01); *C08J 5/18* (2013.01); *H01L 31/0216* (2013.01); *H01L 31/049* (2014.12); *H01L 31/0481* (2013.01); *C08J 2367/02* (2013.01); *C08K 5/13* (2013.01); *Y02E 10/50* (2013.01)

(58) Field of Classification Search
None
See application file for complete search history.

(56) References Cited

U.S. PATENT DOCUMENTS

| 4,604,453 | A | 8/1986 | Kuze et al. |
| 7,794,822 | B2 | 9/2010 | Kliesch et al. |
| 8,664,351 | B2* | 3/2014 | Nozawa ............... C08G 63/85 136/256 |
| 2002/0065346 | A1 | 5/2002 | Murschall et al. |
| 2005/0104030 | A1 | 5/2005 | Kato et al. |
| 2007/0237972 | A1 | 10/2007 | Kliesch et al. |
| 2007/0238816 | A1 | 10/2007 | Kliesch et al. |
| 2010/0000603 | A1 | 1/2010 | Tsuzuki et al. |

FOREIGN PATENT DOCUMENTS

| EP | 2262000 A1 | 12/2010 |
| JP | S51-046372 A | 4/1976 |
| JP | S61-002731 A | 1/1986 |
| JP | H04-028218 B2 | 5/1992 |
| JP | H06-107923 A | 4/1994 |
| JP | H06-039521 B2 | 5/1994 |
| JP | H06-045175 B2 | 6/1994 |
| JP | H11-315212 A | 11/1999 |
| JP | 2000-119417 A | 4/2000 |
| JP | 2002-026354 A | 1/2002 |
| JP | 2002-134770 A | 5/2002 |
| JP | 2002-187965 A | 7/2002 |
| JP | 2002-249564 A | 9/2002 |
| JP | 2002-249609 A | 9/2002 |
| JP | 2003064175 A * | 3/2003 |
| JP | 2003-160648 A | 6/2003 |
| JP | 2003-268211 A | 9/2003 |
| JP | 2003-342356 A | 12/2003 |
| JP | 2004-250485 A | 9/2004 |
| JP | 2005-011923 A | 1/2005 |
| JP | 2007-099971 A | 4/2007 |
| JP | 2007-150084 A | 6/2007 |
| JP | 2007-177136 A | 7/2007 |
| JP | 2007-204538 A | 8/2007 |
| JP | 2007-276478 A | 10/2007 |
| JP | 2007-302878 A | 11/2007 |
| JP | 2008-085293 A | 4/2008 |
| JP | 2008-231399 A | 10/2008 |

(Continued)

OTHER PUBLICATIONS

Machine Translation of JP 2002-249609 (original document provided by Applicant).*
Machine translation of JP 2003-064175.*
Japanese Patent Office, Notice of Reasons for Rejection in Japanese Patent Application No. 2010-182898 (Sep. 10, 2010).
Taiwanese Patent Office, Rejection Decision on Examination in Taiwanese Patent Application No. 100129306 (Sep. 22, 2014).
Japanese Patent Office, International Search Report in International Patent Application No. PCT/JP2011/068627 (Nov. 29, 2011).
State Intellectual Property Office of People's Republic of China, First Office Action in Chinese Patent Application No. 201180039978.3 (Dec. 26, 2013).
Taiwanese Patent Office, Notification for the Opinion of Examination in Taiwanese Patent Application No. 100129306 (Jan. 20, 2014).
Japanese Patent Office, Notification of Reasons for Rejection in Japanese Patent Application No. 2011-010476 (Aug. 5, 2014).
Japanese Patent Office, Notification of Reasons for Rejection in Japanese Patent Application No. 2011-010477 (Aug. 5, 2014).

(Continued)

*Primary Examiner* — Catherine S Branch
(74) *Attorney, Agent, or Firm* — Leydig, Voit & Mayer, Ltd.

(57) ABSTRACT

Provided is a hydrolysis-resistant polyester film having a low acid value due to suppression of acid value-increase during film formation. The hydrolysis-resistant polyester film of the present invention is a polyester film comprising a polyester resin composition, wherein the polyester resin composition that forms the films comprises 0.03 to 6.7 eq/ton of hindered phenol structural units, an acid value of a polyester that forms the film is less than 25 eq/ton, and an intrinsic viscosity of a polyester that forms the film is more than 0.64 dL/g and not less than 0.90 dL/g.

16 Claims, No Drawings

(56) References Cited

FOREIGN PATENT DOCUMENTS

| JP | 2010-003900 A | 1/2010 | | |
|----|---------------|--------|---|---|
| JP | 2010-031174 A | 2/2010 | | |
| JP | 2010-031207 A | 2/2010 | | |
| JP | 2010-161138 A | 7/2010 | | |
| JP | 2010-212272 A | 9/2010 | | |
| JP | 2010-235824 A | 10/2010 | | |
| JP | 2010-260903 A | 11/2010 | | |
| JP | 2011-021180 A | 2/2011 | | |
| JP | WO 2011087043 A1 * | 7/2011 | ............. | C08G 63/85 |
| WO | WO 2009/123357 A1 | 10/2009 | | |
| WO | WO 2010/123087 A1 | 10/2010 | | |

OTHER PUBLICATIONS

Japanese Patent Office, Decision of Rejection in Japanese Patent Application No. 2011-010476 (Apr. 21, 2015).
Japanese Patent Office, Decision of Rejection in Japanese Patent Application No. 2011-010477 (Apr. 21, 2015).
Japanese Patent Office, Notification of Reasons for Rejection in Japanese Patent Application No. 2011-049962 (Jun. 2, 2015).
Japanese Patent Office, Notification of Reasons for Rejection in Japanese Patent Application No. 2011-049962 (Oct. 21, 2014).
Japanese Patent Office, Notification of Office Action in Japanese Patent Application No. 2015-139707 (Jun. 21, 2016).
European Patent Office, Extended European Search Report in European Patent Application No. 11818212.0 (Oct. 27, 2016).

* cited by examiner

Ilydrolysis-Resistant POLYESTER FILM

CROSS-REFERENCE TO RELATED APPLICATIONS

This patent application is the U.S. national phase of International Patent Application No. PCT/JP2011/068627, filed Aug. 17, 2011, which claims the benefit of Japanese Patent Application No. 2010-182898, filed Aug. 18, 2010, and Japanese Patent Application No. 2011-049962, filed on Mar. 8, 2011, which are incorporated by reference in their entireties herein.

TECHNICAL FIELD

The present invention relates to a hydrolysis-resistant polyester film. More specifically, the present invention relates to a weather-resistant polyester film for electrical insulation, which is for use in a solar cell back sheet, a solar cell front sheet, motor insulation, a capacitor and the like. The present invention relates particularly to a hydrolysis-resistant polyester film which is suitably used for solar cell back sheets.

BACKGROUND ART

Polyester films are excellent in mechanical and chemical properties, and are used in a wide range of fields such as those of packaging, magnetic tapes, electronic components, electrical insulation and protective sheets. In solar cell back sheet applications, solar cell front sheet applications, motor insulation applications and capacitor applications, the films are exposed to a severe environment for a long period of time, and therefore a higher level of durability is required. However, when the polyester film is used in a high-temperature and high-humidity environment, there is a problem that hydrolysis occurs at the ester bond site in the molecular chain, so that mechanical properties become worse. Thus, various studies have been conducted for improvement in hydrolysis-resistant performance of polyester films.

For example, Patent Document 1 discloses a technique of improving hydrolysis resistance by lowering the acid value of a resin. Patent Documents 2 to 4 disclose techniques of improving weather resistance by increasing the molecular weight of a resin.

Patent Documents 5 to 7 disclose techniques of adding a carboxylic acid end capping agent such as an epoxy compound, an oxazoline compound or an isocyanate compound for improving the hydrolysis resistance of a polyester film. A hindered phenol-based antioxidant is used in parallel therewith as an additive for prevention of deactivation of an end capping agent and prevention of gelation. Further, Patent Documents 8 to 10 disclose techniques of improving weather resistance and various properties by homogeneously mixing and blending a polyester and other resins. A hindered phenol compound is also used in parallel therewith as an additive for preventing decomposition and coloring of a resin to be blended.

As to the hindered phenol-based compound, a technique of preventing heat aging of a molded product by adding the compound as an antioxidant has been previously widely known in the art of engineering plastics such as injection molding (Patent Document 11).

PRIOR ART DOCUMENTS

Patent Documents

Patent Document 1: JP-A-2007-150084
Patent Document 2: JP-A-2002-134770
Patent Document 3: JP-A-2005-11923
Patent Document 4: JP-A-2002-26354
Patent Document 5: JP-A-2007-302878
Patent Document 6: JP-A-2007-276478
Patent Document 7: JP-A-2007-99971
Patent Document 8: JP-A-2003-268211
Patent Document 9: JP-A-2000-119417
Patent Document 10: JP-A-2004-250485
Patent Document 11: JP-A-6-107923

SUMMARY OF THE INVENTION

Problems to be Solved by the Invention

However, in Patent Documents 1 to 4, the intrinsic viscosity of a resin increases, so that shear heat generation easily occurs. Therefore, a film having a sufficiently low acid value cannot be obtained because the acid value rather increases due to decomposition during melt molding. Methods in Patent Documents 5 to 10 do not improve the weather resistance of a film formed essentially of a polyester alone.

On the other hand, a method of adding a hindered phenol-based compound as an antioxidant as in Patent Document 11 is intended for preventing degradation of a molded product even though it is exposed to a high temperature, and therefore a large amount of the compound is added. Therefore, when the method is applied to a film, the lip periphery of a die and rolls such as a chill roll and a drawing roll may be contaminated, thereby making it difficult to form a film stably for a long time period. Moreover, there may arise such a problem that a stabilizer bleeds out, leading to, for example, delamination of a laminated solar cell back sheet.

Further, the film is heat-set after being drawn in order to suppress shrinkage by heat associated with lamination processing, but the film tends to be easily broken because it probably becomes fragile when heat set conditions are intense.

The present invention has been devised in view of such problems of the prior art. That is, it is an object of the present invention to provide a hydrolysis-resistant polyester film having a low acid value due to suppression of acid-value increase during film formation. When a polyester film excellent in hydrolysis resistance is used for a back sheet of a solar cell, excellent weather resistance not previously attainable can be achieved.

Means for Solving the Problems

The present inventors have conducted vigorous studies on a high hydrolysis-resistant film, and have found the following matters.

When an acid value is lowered at the stage of a resin raw material as in the prior art, decomposition of a polyester proceeds due to thermal history imposed within an extruder during film formation, so that the acid value is slightly increased. Particularly, this tendency is noticeable in a resin raw material having a high molecular weight and a high intrinsic viscosity. Even though acid-value increase occurring during melt extrusion is slight, decomposition of a polyester main chain is catalyzed by an acid, and therefore decomposition proceeds in a self-propagational manner due to such a catalytic action. Therefore, as a result, weather resistance is reduced over a long time period of use. Thus, it has been found that slight acid-value increase occurring during melt molding of a resin raw material has significant influences on long-term durability.

Then, vigorous studies have been conducted in order to suppress acid-value increase of a resin raw material within an extruder. As a result, an unexpected finding has been obtained that by adding an extremely slight amount of a hindered phenol compound as compared to a previously applied amount, acid-value increase is suppressed and resultantly, long-term durability is remarkably improved. Here, the effective added amount of the hindered phenol compound is not required to be such a large amount as used in engineering plastics (not less than several thousand ppm), but a significant effect is exerted even in a small amount of not more than several hundred ppm.

In addition, it has been found that by introducing a slight amount of a component other than ethylene terephthalate into the polyester of the film, excessive crystallization in a heat set step is suppressed, so that a reduction in fracture elongation is suppressed without reducing physical properties.

The present invention is based on the finding of a new effect of a hindered phenol compound. That is, the present invention is a hydrolysis-resistant polyester film including a polyester resin composition, wherein the polyester resin composition that forms the film contains 0.03 to 6.7 eq/ton of hindered phenol structural units, an acid value of a polyester that forms the film is less than 25 eq/ton, and an intrinsic viscosity of a polyester that forms the film is more than 0.64 dL/g and not more than 0.90 dL/g.

The polyester preferably includes terephthalic acid and/or naphthalenedicarboxylic acid as acid components, the total content of the terephthalic acid and naphthalenedicarboxylic acid is not less than 90 mol % based on total acid components, the polyester includes ethylene glycol and/or diethylene glycol as glycol components, and the total content of the ethylene glycol and diethylene glycol is not less than 90 mol % based on total glycol components.

The polyester is preferably homo-polyethylene terephthalate or homo-polyethylene naphthalate.

The polyester is also preferably a copolymer having ethylene terephthalate as a main constituent, the content of acid components other than terephthalic acid is not more than 7 mol % based on total acid components, and/or the content of glycol components other than ethylene glycol is not more than 7 mol % based on total glycol components. In this case, in the polyester, the total content of acid components other than terephthalic acid and glycol components other than ethylene glycol, which form the polyester, is preferably not more than 7 mol % based on the sum of total acid components and total glycol components.

The polyester resin composition preferably does not substantially contain a compound having a substituent reactive with an OH group or a carboxyl group, except an OH group and a carboxyl group. The content of the polyester in the polyester resin composition is preferably more than 90% by mass.

The thermal-oxidative decomposition resistance parameter (TOD) of the polyester resin composition that forms the film is preferably not more than 0.25.

The polyester is preferably polymerized using as a polymerization catalyst at least one selected from the group consisting of an aluminum compound, an antimony compound, a germanium compound and a titanium compound.

The polyester is preferably polymerized using as a polymerization catalyst a germanium compound in an amount of not less than 10 ppm and not more than 200 ppm in terms of a Ge atom, a titanium compound in an amount of not less than 1 ppm and not more than 30 ppm in terms of a Ti atom, or an antimony compound in an amount of not less than 50 ppm and not more than 400 ppm in terms of an Sb atom. Further, the polyester is preferably polymerized using a calcium compound, an antimony compound, a lithium compound and a phosphorus compound as a polymerization catalyst.

The apparent specific gravity of the film is preferably 0.7 to 1.3.

The polyester resin composition preferably contains a hindered phenol compound in an amount of not less than 10 ppm and less than 200 ppm. The hindered phenol compound is preferably added to the polyester resin composition during film formation.

The film is preferably for use in a solar cell back sheet, a solar cell front sheet or electrical insulation.

The present invention also includes a solar cell, wherein the polyester film is laminated on at least any one of a light receiving surface and a surface opposite to the light receiving surface.

Effects of the Invention

The hydrolysis-resistant polyester film of the present invention is substantially formed of a polyester resin while having good hydrolysis-resistant performance. Therefore, the hydrolysis-resistant polyester film can be suitably used for applications that require durability, such as a solar cell back sheet application, a solar cell front sheet application and an electrical insulation application.

MODE FOR CARRYING OUT THE INVENTION

In the present invention, the polyester refers to a polyester itself that is subjected to polycondensation as a raw material. The polyester resin composition refers to one that is further added, to the polyester, substances for retaining a function as a polyester and modifying a polyester, such as a stabilizer, an end-capping agent and other resins compatible with the polyester. The film resin composition refers to one that is further added, to the polyester resin composition, substances for imparting a film function, such as a colorant, a lubricant filler and a void generator. Various kinds of stabilizers and fillers may be added irrespective of requirements for polycondensation during polycondensation, but when the polyester resin composition and film resin composition are mentioned, these additives in polymerization are also included in the polyester resin composition and the film resin composition.

In the present invention, a hindered phenol structure is incorporated in the polyester resin composition that forms the film. The lower limit of the content of the hindered phenol structure in the polyester resin composition is preferably 0.03 eq/ton, more preferably 0.1 eq/ton, further preferably 0.17 eq/ton, especially preferably 0.2 eq/ton, and most preferably 0.22 eq/ton. If the content of the hindered phenol structure in the polyester resin composition is less than the above-mentioned lower limit value, effects for sufficiently improving the weather resistance may not be obtained.

On the other hand, the upper limit of the content of the hindered phenol structure is preferably 6.7 eq/ton, more preferably 3.4 eq/ton, further preferably 3.35 eq/ton, still further preferably 1.69 eq/ton, especially preferably 1.5 eq/ton, and most preferably 1.4 eq/ton. If the content is more than the above-mentioned upper limit value, the effect is saturated, thus being disadvantageous in terms of economy. In addition, die lip contamination, chill roll contamination, conveyance roll contamination and drawing roll contamination tend to easily occur during film formation, and therefore frequent cleaning is required, so that stable production is difficult in some cases. Further, if the content is more than the above-mentioned upper limit value, the hindered phenol compound bleeds out, so that adhesiveness is reduced, leading to a reduction in adhesion between the polyester film and the functional layer. Thus, for example, a reduction in adhesiveness between the polyester film and a moisture barrier and a light reflection layer such as an aluminum foil, and delamination between the polyester film and a sealing material such as an ethylene vinyl acetate polymer may be caused.

Hindered phenol structures concerned here include all of the structure having t-butyl groups on both sides of the OH group of the benzene ring, the structure having a t-butyl group on one side of the OH group of the benzene ring and a methyl group on the other side of the OH group of the benzene ring (semi-hindered phenol) and the structure having a t-butyl group on one side of the OH group of the benzene ring and hydrogen on the other side of the OH group of the benzene ring (less-hindered phenol).

When the hindered phenol compound is added during polymerization, and so on, the hindered phenol compound may be incorporated in the polyester. A hindered phenol structure part thus incorporated in the polyester molecular chain is also included as a subject of the hindered phenol structures.

A polyester resin composition containing a hindered phenol structure is obtained by adding a hindered phenol compound to a polyester. A commercially available hindered phenol compounds have a molecular weight of about 250 to 300 per hindered phenol structural unit. Therefore, the lower limit of the added amount of the hindered phenol compound is preferably 10 ppm, more preferably 30 ppm, further preferably 50 ppm, especially preferably 60 ppm, and most preferably 65 ppm, based on the polyester resin composition. The upper limit of the aforementioned added amount is preferably less than 2000 ppm, more preferably less than 1000 ppm, further preferably less than 800 ppm, still further preferably less than 500 ppm, especially preferably less than 450 ppm, and most preferably less than 400 ppm.

The hindered phenol compound may be added during polymerization of the polyester, or may be added during film formation. When the hindered phenol compound is added during film formation, a method is preferable in which a master batch is prepared and added.

Examples of the hindered phenol compound include triethylene glycol-bis[3-(3-t-butyl-5-methyl-4-hydroxyl phenylpropionate, 1,6-hexanediol-bis[3-(3,5-di-t-butyl-4-hydroxyphenyl)propionate], 2,4-bis-(n-octylthio)-6-(4-hydroxy-3,5-di-t-butylanilino)-1,3,5-triazine, pentaerythrityl tetrakis[3-(3,5-di-t-butyl-4-hydroxyl phenyl) propionate], 2,2-thio-diethylenebis[3-(3,5-di-t-butyl-4-hydroxyphenyl)propionate], octadecyl-3-(3,5-di-t-butyl-4-hydroxyphenyl)propionate, N,N'-hexamethylenebis(3,5-di-t-butyl-4-hydroxy-hydrocinnamamide), 3,5-di-t-butyl-4-hydroxybenzylphosphonate-diethyl ester, 1,3,5-trimethyl-2,4,6-tris(3,5-di-t-butyl-4-hydroxybenzyl)benzene, bis(ethyl-3,5-di-t-butyl-4-hydroxybenzylphosphonate)calcium, tris-(3,5-di-t-butyl-4-hydroxybenzyl)isocyanurate and iso-octyl-3-(3,5-di-t-butyl-4-hydroxyphenyl) propionate. These compounds are commercially available as Irganox (registered trademark). Among them, those having a vapor pressure at 20° C. of not more than $1.0 \times 10^{-5}$ Pa, further preferably not more than $1.0 \times 10^{-6}$ Pa, and especially preferably not more than $1.0 \times 10^{-7}$ Pa are preferable for reduction of vaporization during film formation. When added during polymerization, those having a vapor pressure at 20° C. of not more than $1.0 \times 10^{-10}$ Pa are preferable for prevention of distillation in polycondensation.

Further, the polyester resin composition that forms the film may contain a phosphorus-based stabilizer. The lower limit of the content of the phosphorus-based stabilizer is preferably 10 ppm, more preferably 30 ppm, further preferably 50 ppm, and especially preferably 60 ppm. If the content is less than the above-mentioned lower limit value, a sufficient effect may not be obtained. The upper limit of the content of the phosphorus-based stabilizer is preferably 1000 ppm, more preferably 700 ppm, further preferably 500 ppm, especially preferably 400 ppm, and most preferably 300 ppm. If the content is more than the above-mentioned upper limit value, die lip contamination, chill roll contamination, conveyance roll contamination and drawing roll contamination tend to easily occur during film formation, and therefore frequent cleaning is required, so that stable production is difficult in some cases. In addition, if the content exceeds the above-mentioned range, the phosphorus-based stabilizer may bleed out to cause a reduction in adhesiveness between the polyester film and a moisture barrier and a light reflection layer such as an aluminum foil, and delamination between the polyester film and a sealing material such as an ethylene vinyl acetate polymer.

Examples of the phosphorus-based stabilizer include tris (2,4-di-t-butylphenyl)phosphite (Irgafos (registered trademark) 168), tetrakis(2,4-di-t-butylphenyl)-4,4'-biphenylenediphosphite (Sandostab (registered trademark) P-EPQ), and tetrakis(2,4-di-t-butyl-5-methyphenyl) [1,1-biphenyl]-4,4'-diylbisphosphonite (GSY-P101 manufactured by OSAKI INDUSTRY Co., LTD.).

The intrinsic viscosity (IV) of the polyester that forms the film is preferably more than 0.64 dL/g (the value is not included but exceeded; the same applies hereinafter), more preferably more than 0.65 dL/g, further preferably more than 0.66 dL/g, especially preferably more than 0.67 dL/g, and most preferably more than 0.68 dL/g. If the intrinsic viscosity is not more than the above-mentioned range, sufficient weather resistance may not be obtained. The upper limit of the intrinsic viscosity is preferably 0.90 dL/g, more preferably 0.85 dL/g, further preferably 0.82 dL/g, especially preferably 0.80 dL/g, and most preferably 0.78 dL/g. If the intrinsic viscosity is more than the above-mentioned upper limit value, some difficulties of molding arise in a film forming machine that is currently widely used. In addition, the temperature rises during film formation, and the polyester is decomposed, so that the suppression effect by the hindered phenol compound relatively becomes lower, leading to an increase in acid value in some cases.

For ensuring that the intrinsic viscosity of the polyester that forms the film falls within the above-mentioned range, the intrinsic viscosity of the raw material polyester is preferably more than 0.66 dL/g, more preferably more than 0.67 dL/g, further preferably more than 0.68 dL/g, especially preferably more than 0.69 dL/g, and most preferably more than 0.7 dL/g. The upper limit of the intrinsic viscosity of the raw material polyester is preferably 0.92 dL/g, more preferably 0.88 dL/g, further preferably 0.84 dL/g, especially preferably 0.82 dL/g, and most preferably 0.80 dL/g.

The acid value of the polyester that forms the film is preferably less than 25 eq/ton, more preferably less than 22 eq/ton, further preferably less than 20 eq/ton, and especially preferably less than 18 eq/ton. In the case where the acid value is more than these values, effects from hindered phenol compound cannot be sufficiently exploited even when the hindered phenol compound is contained. That is, the effect of the hindered phenol compound becomes relatively lower as the acid value increases, since the acid value suppressing effect by the hindered phenol compound at the time of melting a resin becomes relatively lower as the absolute acid value of the polyester increases. The lower limit of the acid value is preferably lower, and therefore is not particularly limited, but in practice is preferably not less than 0 eq/ton, more preferably not less than 1 eq/ton, further preferably not less than 2 eq/ton, and especially preferably not less than 3 eq/ton in view from productivity and the like.

When the film is required to have high weather resistance as in solar cell back sheet and electrical insulation applications, the acid value of the polyester that forms the film is preferably less than 15 eq/ton, more preferably less than 13 eq/ton, further preferably less than 12 eq/ton, especially preferably less than 11 eq/ton, and most preferably less than 10 eq/ton. If the acid value exceeds the above-mentioned range, high hydrolysis resistance may not be obtained.

When it is desired to have such high weather resistance while having a low acid value, it is preferable not to include a large amount of a coloring pigment, a void forming agent and the like in the film. If these are added in a large amount, they are added during polymerization with difficulty, and are required to be added during film formation. Thus, it is necessary to intensify melt and kneading conditions during film formation for uniform dispersion, so that an increase of acid value during film formation may become considerable. The added amount of the coloring pigment and void forming agent in this case is preferably not more than 5% by mass, further preferably not more than 3.0% by mass, and especially preferably not more than 2.5% by mass. If the added amount exceeds this range, the amount of a master batch may increase, or the pigment may be added during polymerization with difficulty, thus being disadvantageous for reducing the acid value.

For ensuring that the acid value of the polyester that forms the film falls within the above-mentioned range, the acid value of the raw material polyester is preferably not more than 10 eq/ton, more preferably not more than 9 eq/ton, further preferably not more than 8 eq/ton, and especially preferably not more than 7 eq/ton. If the acid value exceeds the above-mentioned range, the acid value of the polyester that forms the film may not be reduced as desired. The lower limit of the acid value of the raw material polyester is preferably lower, and is not particularly limited, but in practice is about −3 eq/ton. According to the method in Example, a negative value may be obtained as an acid value if the acid value is reduced to an extremity. Further, solid phase polymerization is carried out for reducing the acid value of the raw material polyester, but the rate of solid phase polymerization decreases as the acid value is reduced. Therefore, when considering productivity, the lower limit of the acid value of the raw material polyester is preferably 0 eq/ton, more preferably 1 eq/ton, and further preferably 2 eq/ton.

The lower limit of the content of a cyclic trimer (CT) in the polyester that forms the film is preferably 0.20% by mass, more preferably 0.25% by mass, further preferably 0.28% by mass, and especially preferably 0.30% by mass. If the content of the CT is less than the above-mentioned lower limit value, it takes a long time for solid phase polymerization, leading to poor productivity. The upper limit of the content of the CT is preferably 0.60% by mass, more preferably 0.55% by mass, and further preferably 0.50% by mass. If the content of the CT is more than the above-mentioned upper limit value, roll contamination and die lip contamination may occur. The CT may be precipitated on the film surface to cause whitening of the film or cause pinholes in a gas barrier layer when the gas barrier layer is deposited on the film surface. The content of CT can be reduced by solid phase polymerization.

The content of acetaldehyde in the polyester resin composition that forms the film is preferably not more than 50 ppm, further preferably not more than 40 ppm, and especially preferably not more than 30 ppm. Acetaldehyde easily undergoes a condensation reaction of acetaldehyde molecules, water is generated as a side reaction product, and the water may cause hydrolysis of the polyester to proceed. The lower limit of the content of acetaldehyde is about 1 ppm in practice. For ensuring that the amount of acetaldehyde falls within the above-mentioned range, the following methods can be employed: a method of keeping the oxygen concentration low in steps of melt polymerization, solid phase polymerization and the like during production of a resin; a method of keeping the oxygen concentration low during storage and drying of a resin; a method of lowering a heat history imposed on a resin in an extruder, a melt pipe, a die and the like during production of a film; and a method of ensuring that shear is not locally intensified by a screw structure and the like of an extruder during melting.

The polyester that forms the film is preferably a polyester formed of a dicarboxylic acid and a diol. Examples of the dicarboxylic acid include aromatic dicarboxylic acids such as terephthalic acid, isophthalic acid, orthophthalic acid, naphthalenedicarboxylic acid and biphenyldicarboxylic acid; and aliphatic dicarboxylic acids such as adipic acid, sebacic acid and cyclohexanedicarboxylic acid. The polyester that forms the film is preferably a polyester formed of an aromatic dicarboxylic acid and a diol. As the aromatic dicarboxylic acid, terephthalic acid and naphthalenedicarboxylic acid are preferable. An aromatic dicarboxylic acid other than terephthalic acid and naphthalenedicarboxylic acid, or an aliphatic dicarboxylic acid may be copolymerized.

Terephthalic acid and naphthalenedicarboxylic acid may be used at any ratio, but the lower limit of the total content of terephthalic acid and naphthalenedicarboxylic acid is preferably 95 mol %, more preferably 97 mol %, further preferably 99 mol %, and especially preferably 100 mol %. If the total content is less than the above-mentioned lower limit value, physical properties and weather resistance may be reduced. The upper limit of the total content of terephthalic acid and naphthalenedicarboxylic acid is 100 mol %. The content of terephthalic acid is preferably not less than 95 mol %, more preferably not less than 97 mol %, further preferably not less than 99 mol %, and especially preferably 100 mol %.

Examples of the diol include alkylene glycols such as ethylene glycol, propylene glycol, 1,3-propanediol, 1,4-butanediol, neopentyl glycol and cyclohexanedimethanol; polyalkylene glycols such as polytetramethylene glycol; and bisphenol A-EO adducts and bisphenol A-PO adducts. Among them, ethylene glycol is preferable.

A part of ethylene glycol is converted into diethylene glycol during polymerization, and incorporated in the polyester. The lower limit of the total content of ethylene glycol and diethylene glycol is preferably 90 mol %, more preferably 95 mol %, further preferably 98 mol %, and especially preferably 100 mol %. If the total content is less than the above-mentioned lower limit value, physical properties and weather resistance (aliphatic) may be reduced. The upper limit of the total content of ethylene glycol and diethylene glycol is 100 mol %.

The lower limit of the content of diethylene glycol (in glycol components) in the polyester is preferably 0.5 mol %, more preferably 0.8 mol %, and further preferably 1 mol %. The content of less than the above-mentioned lower limit value may be in practice difficult to achieve. The upper limit of the content of diethylene glycol is preferably 3 mol %, more preferably 2.6 mol %, further preferably 2.4 mol %, and especially preferably 2.2 mol %. If the content is more than the above-mentioned upper limit value, weather resistance may be reduced. The generation of diethylene glycol can be suppressed by adding an alkali component during esterification reaction.

Preferred polyesters include homo-polyethylene terephthalate, homo-polyethylene naphthalate and homo-polybutylene terephthalate. The homo-polyethylene terephthalate, homo-polyethylene naphthalate and homo-polybutylene terephthalate here may be one in which a by-product such as diethylene glycol generated during polymerization is copolymerized.

In a preferred embodiment, the polyester that forms the film is a copolymer having ethylene terephthalate as a main constituent. Namely, those containing, as acid components, constituents other than terephthalic acid in an amount of not more than 7 mol % and/or glycol components other than ethylene glycol in an amount of not more than 7 mol % are preferable. However, diethylene glycol and triethylene glycol produced by oligomerization of ethylene glycol during polycondensation is considered as ethylene glycol, and are not included in glycol components other than ethylene glycol. Mol % mentioned here refers to a value calculated, under conditions that the total amounts of acid components and glycol components is 100 mol %, respectively.

The lower limit of the content of acid components other than the terephthalic acid component is preferably 0.01 mol %, more preferably 0.1 mol %, further preferably 0.5 mol %, and especially preferably 1 mol %. If the content is less than the above-mentioned lower limit value, the effect of preventing excessive crystallization may be insufficient. The upper limit of the content of acid components other than the terephthalic acid component is preferably 7 mol %, more preferably 6 mol %, further preferably 5 mol %, and especially preferably 3.5 mol %. If the content is more than the above-mentioned upper limit value, the rate of shrinkage by heat in a lamination step and so on may increase.

The lower limit of the content of glycol components other than ethylene glycol is preferably 0.01 mol %, more preferably 0.1 mol %, further preferably 0.5 mol %, and especially preferably 1 mol %. If the content is less than the above-mentioned lower limit value, the effect of preventing excessive crystallization may be insufficient. The upper limit of the content of glycol components other than ethylene glycol is preferably 7 mol %, more preferably 6 mol %, further preferably 5 mol %, especially preferably 3.5 mol %. If the content is more than the above-mentioned upper limit value, the rate of shrinkage by heat in a lamination step and so on may increase.

The lower limit of the total amount of acid components other than the terephthalic acid component and glycol components other than ethylene glycol component is preferably 0.01 mol %, more preferably 0.1 mol %, further preferably 0.5 mol %, and especially preferably 1 mol % based on the sum of total acid components and total glycol components. The upper limit of the total amount of acid components other than the terephthalic acid component and glycol components other than ethylene glycol is preferably 7 mol %, more preferably 6 mol %, further preferably 5 mol %. Mol % mentioned here refers to a value calculated, under conditions that the total amounts of acid components and glycol components is 100 mol %, respectively, and the sum thereof refers to a value obtained by summing the respective values.

Examples of the acid component other than the terephthalic acid component include naphthalenedicarboxylic acid, isophthalic acid, orthophthalic acid, biphenyl dicarboxylic acid, adipic acid, sebacic acid and cyclohexanedicarboxylic acid. Among them, naphthalenedicarboxylic acid, isophthalic acid, orthophthalic acid, biphenyl dicarboxylic acid and cyclohexanedicarboxylic acid are preferable, and naphthalenedicarboxylic acid and isophthalic acid are especially preferable, in the sense that hydrolysis resistance is hard to reduce and the melting point and glass transition temperature are hard to decrease.

Examples of the glycol component other than ethylene glycol component include propylene glycol, 1,3-propanediol, 1,4-butanediol, 1,5-pentanediol, 1,6-hexanediol, neopentyl glycol, 2-methyl-1,3-propanediol, cyclohexanedimethanol, bisphenol A-EO adducts, bisphenol A-PO adducts, diethylene glycol, polytetramethylene glycol and the like. Among them, 1,3-propanediol, 1,4-butanediol, neopentyl glycol, 2-methyl-1,3-propanediol and cyclohexanedimethanol are preferable, and 1,3-propanediol, neopentyl glycol and cyclohexanedimethanol are especially preferable, in the sense that the melting point and glass transition temperature are hard to decrease.

A part of ethylene glycol is converted into diethylene glycol and triethylene glycol during polymerization, and incorporated in the polyester. Such diethylene glycol and the like as by-products are not included in the amount of the glycol components other than ethylene glycol. The lower limit of the content of diethylene glycol in the polyester is preferably 0.5 mol %, more preferably 0.8 mol %, and further preferably 1 mol %. The content of less than the above-mentioned lower limit value may be in practice difficult to achieve. The upper limit of the content of diethylene glycol is preferably 2.5 mol %, more preferably 2.3 mol %, further preferably 2.0 mol %, and especially preferably 1.8 mol %. If the content is more than the above-mentioned upper limit value, weather resistance may be reduced. The generation of diethylene glycol can be suppressed by adding an alkali component during esterification reaction.

The method for introducing acid components other than the terephthalic acid component and glycol components other than ethylene glycol component may be any one of a method by copolymerization and a method by blending. The method by blending is preferably a method in which a polyester obtained by copolymerizing about 10 to 50 mol % of acid components other than the terephthalic acid component and glycol components other than ethylene glycol component with ethylene terephthalate is blended with homo-polyethylene terephthalate.

The configuration of the present invention will be described below.

1. Raw Material Polyester

A raw material polyester that is preferably used in the present invention can be produced by a method in which a dicarboxylic acid and a diol component are subjected to an esterification reaction (esterification method) or subjected to an ester exchange reaction for reacting a dimethyl ester of a dicarboxylic acid with a diol component (ester exchange method or DMT method), followed by subjecting the reaction product to polycondensation under a reduced pressure.

The polycondensation catalyst in polymerization of the polyester may be one that is commonly used, and examples thereof include Al compounds, Sb compounds, Ge compounds and Ti compounds. Among them, Al compounds, Sb compounds and Ti compounds are preferable from the viewpoint of economy. Al compounds, Sb compounds and Ge compounds are preferable from the viewpoint of heat-resistance stability. Sb compounds, Ge compounds and Ti compounds are preferable from the viewpoint of industrially stable availability of the catalyst. Sb compounds are most preferable with these things considered.

The Al compound alone has a low activity, and those whose catalytic activity is enhanced by combination with other metals are preferable. For this combination, for example, Al/Co, Al/Li, Al/Na, Al/Mg or the like is preferably used. Also preferable is one whose catalytic activity is enhanced by further combining a phosphorus compound (with the exceptions of phosphorus compounds having a hindered phenol structure within a molecule) with Al or a combination of Al with other metals. Especially preferable phosphorus compounds are phosphonic acids having within a molecule an aromatic group represented by Ar—$CH_2$—P(=O)(OH)$_2$ (Ar represents an aryl group, with the exceptions of those having a hindered phenol structure), and also include alkyl esters and salt compounds thereof.

Examples of the germanium compound include germanium dioxide and germanium tetrachloride. Among them, germanium dioxide is preferable. The lower limit of the added amount of the germanium compound is preferably 10 ppm, more preferably 20 ppm, and further preferably 30 ppm in terms of a Ge atom. If the added amount is less than the above-mentioned lower limit value, the polycondensation reaction may be slowed, leading to poor productivity. The upper limit of the added amount is preferably 200 ppm, more preferably 150 ppm, further preferably 100 ppm in terms of a Ge atom. The germanium compound is expensive, and addition thereof in an amount of more than the above-mentioned upper limit is not preferable in terms of economy. When the germanium compound is used, it is also preferable to deactivate the catalyst by treating polyester chips with hot water after production of the polyester.

Examples of the titanium compound include tetra-n-propyl titanate, tetraisopropyl titanate, tetra-n-butyl titanate, tetraisobutyl titanate, tetra-tert-butyl titanate, tetracyclohexyl titanate, tetraphenyl titanate, titanium oxalate, phthalate titanate, trimellitate titanate and pyromellitate titanate. Among them, tetra-n-butoxy titanate and trimellitate titanate are preferable. Particularly, trimellitate titanate is preferable from the viewpoint of yellowing resistance and heat stability. The lower limit of the added amount of the Ti compound is preferably 1 ppm, more preferably 2 ppm, further preferably 3 ppm in terms of a Ti atom. If the added amount is less than the above-mentioned lower limit value, the polycondensation reaction may be slowed, leading to poor productivity. The upper limit is preferably 30 ppm, more preferably 25 ppm, further preferably 20 ppm in terms of a Ti atom. If the added amount is more than the above-mentioned upper limit value, thermal decomposition may become harder during film formation, leading to poor weather resistance. When the titanium compound is used, it is preferable to adjust the activity of the catalyst by adding a phosphorus compound during polymerization. It is also preferable to deactivate the titanium catalyst by adding a phosphorus compound, for example, during film formation, after completion of polymerization. Examples of the phosphorus compound include the phosphoric acids, phosphorous acids and phosphoric acids described later.

Examples of the antimony compound include antimony trioxide, antimony pentaoxide, antimony acetate and antimony glycoxide. Among them, antimony trioxide is preferable. The lower limit of the added amount of the Sb compound is preferably 50 ppm, more preferably 70 ppm, and further preferably 100 ppm in terms of an Sb atom. If the added amount is less than the above-mentioned lower limit value, the polycondensation reaction may be slowed, leading to poor productivity. The upper limit is preferably 400 ppm, more preferably 350 ppm, further preferably 300 ppm in terms of an Sb atom. If the added amount is more than the above-mentioned upper limit value, the amount of foreign matters may increase.

When the polyester is polymerized, an esterification catalyst or an ester exchange catalyst may be used aside from the polycondensation catalyst. Examples of the ester exchange catalyst include fatty acid salts and carbonates of Zn, Cd, Mg, Mn, Co, Ca, Ba and the like, and oxides of Pb, Zn, Sb, Ge and the like.

Particularly when the Sb catalyst is used in polycondensation, it is preferable to use a Ca compound as the ester exchange catalyst. By using the Ca compound, thermal degradation during film formation can be reduced. Also, the Ca catalyst can be deactivated by a phosphorus compound after the ester exchange reaction, and calcium phosphate particles can be generated, and used as a lubricant during film formation. The lower limit of the added amount of the Ca compound is preferably 50 ppm, more preferably 70 ppm, further preferably 100 ppm in terms of a Ca atom. If the added amount is less than the above-mentioned lower limit value, the ester exchange reaction may be slowed, or the amount of calcium phosphate particles precipitated later may decrease, leading to poor slippage at the time of winding a film. The upper limit of the added amount is preferably 400 ppm, more preferably 350 ppm, and further preferably 300 ppm in terms of a Ca atom. If the added amount is more than the above-mentioned upper limit value, not only the effect is saturated, but also the amount of foreign matters may increase.

The lower limit of the added amount of the phosphorus compound added after the ester exchange reaction is preferably 100 ppm, more preferably 150 ppm, and further preferably 200 ppm in terms of a P atom. If the added amount is less than the above-mentioned lower limit value, the amount of calcium phosphate particles precipitated may decrease, leading to poor slippage at the time of winding a film. The upper limit of the added amount is preferably 1000 ppm, more preferably 800 ppm, further preferably 700 ppm in terms of a P atom. If the added amount is more than the above-mentioned upper limit value, the polycondensation reaction may be slowed. Preferred phosphorus compounds include phosphoric acids such as phosphoric acid, phosphorous acid and phosphonic acid; and lower alkyl esters or phenyl esters of these phosphoric acids. One or more phosphorus compounds selected from these phosphoric acid compounds can be used. Specific examples may include phosphoric acid and phosphoric acid esters such as trimethyl phosphate, triethyl phosphate, triphenyl phosphate and an acidic phosphoric acid methyl ester; phosphorous acid and phosphorous acid esters such as trimethyl phosphite and triethyl phosphite; and methyl phosphonic acid, phenyl phosphonic acid and benzyl phosphonic acid, and phosphonic acid esters such as a methyl phosphonic acid methyl ester, a phenyl phosphonic acid ethyl ester and a benzyl phosphonic acid phenyl ester.

It is also preferable to further add a lithium compound. By adding the lithium compound, calcium phosphate particles having such a size that ensures excellent slippage can be efficiently precipitated, and can improve hydrolysis resistance. The lower limit of the added amount of the lithium compound is preferably 20 ppm, more preferably 30 ppm, further preferably 40 ppm, and especially preferably 50 ppm in terms of a lithium atom. The upper limit of the added amount is preferably 300 ppm, more preferably 250 ppm, further preferably 200 ppm in terms of a lithium atom. By ensuring that the added amount falls within the above-mentioned range, a high effect is achieved. Examples of the lithium compound include lithium chloride, lithium hydride and lithium acetate.

Particularly by using the DMT method together with the above-mentioned Sb/Ca/Li/P-based catalyst, a high effect can be obtained for hydrolysis resistance and slippage as a film.

As a method for obtaining a polyester having a low acid value, it is effective to lower the acid value by increasing the esterification rate of an esterified product at the time of entering a polycondensation step after esterification reaction when the esterification method is used. As the method for increasing the esterification rate, a method of adjusting the acid/glycol ratio; a method of adjusting conditions such as the temperature, the time and the like of the esterification reaction; and so on can be employed. In the DMT method, it is preferable to reduce the moisture content of a dicarboxylic acid dimethyl ester and a glycol as raw materials by drying and purification.

In the polycondensation step, an acid is generated due to oxidation by oxygen, and moisture. Therefore, it is preferable to set the temperature of a polycondensation reaction at a lower level; reduce the oxygen concentration of a reaction system; increase the pressure reduction degree; improve stirring efficiency; and so on.

Further, by preliminarily crystallizing a polyester obtained by melt polymerization, followed by subjecting the polyester to solid phase polymerization at a temperature lower than the melting point under a reduced pressure or under circulation of an inert gas, the molecular weight can be increased to reduce the acid value. The solid phase polymerization temperature is preferably 190 to 240° C., and further preferably 195 to 230° C. The solid phase polymerization time is preferably not less than 2 hours, and further preferably not less than 3 hours. The molecular can be increased to reduce the acid value as the time is increased. On the other hand, the degree of reduction of the acid value becomes lower as the polymerization time is increased, therefore the polymerization time is preferably not more than 40 hours from the viewpoint of economy. Adjustment of the molecular weight and the acid value can be appropriately performed by adjusting melt polymerization conditions and solid phase polymerization conditions. The content of the CT can be reduced by carrying out solid phase polymerization.

2. Polyester Resin Composition

In the present invention, a hindered phenol compound is further added to the polyester. In the present invention, those containing these stabilizers and the like, retaining a function as a polyester while being compatible with a polyester, and adding a substance for modifying a polyester are referred to as a polyester resin composition. When the hindered phenol compound is added during polymerization, it is preferably added at the time of adding a polycondensation catalyst just before polycondensation. When the hindered phenol compound is added in the course of the polycondensation step, it can also be added as a slurry of ethylene glycol by a gear pump or the like without cancelling pressure reduction.

The hindered phenol compound can also be added during film formation, and is preferably added as a master batch in this case. As a base resin for the master batch, a raw material polyester for the film is preferably used. The hindered phenol compound concentration of the master batch is preferably higher, but in practice is preferably 1 to 20% by mass. Since the polyester is decomposed during production of the master batch, so that the acid value increases, it is preferable to sufficiently dry the raw material polyester. The water content is comparable to that of the polyester during film formation as described below. During production of the master batch, the components are preferably kneaded while being degassed using an extruder equipped with a vent.

Further, for the polyester resin composition, other stabilizers and the like can be added.

The polyester resin composition preferably does not substantially contain a compound having a substituent reactive with an OH group or a COOH group, except an OH group (hydroxyl group) and a COOH group (carboxyl group). If the polyester contains a compound having a substituent reactive with an OH group or a COOH group, a crosslinking structure is formed with a polyester molecule to cause gelation, or the molecular weight of the polyester increases, so that shear heat generation may occur at the time of melting, leading to a reduction in the effect of the hindered phenol compound.

Examples of the compound having a substituent reactive with an OH group or a COOH group include epoxy, carbodiimide and isocyanate compounds. These are used as an end capping agent and a chain extender. The term "does not substantially contain" here refers to an amount of preferably less than 1% by mass, more preferably less than 0.5% by mass, further preferably less than 0.1% by mass, and more further preferably less than 0.01% by mass, in the polyester resin composition.

Resins other than a polyester, such as a polyurethane, a polyimide and a polycarbonate may be included in the polyester resin composition in a compatible manner for the purpose of modification. In this case, the content of the polyester in the resin composition is preferably more than 90% by mass, more preferably more than 95% by mass, further preferably more than 98% by mass, especially preferably more than 99% by mass, and most preferably more than 99.5% by mass. It is most preferable that only the polyester be contained as a resin.

The thermal-oxidative decomposition parameter (TOD) (hereinafter, referred to as "thermal-oxidative stability parameter (TOS)" in some cases) of the polyester resin composition that forms the film is preferably not more than 0.25, more preferably not more than 0.2, further preferably not more than 0.15, especially preferably not more than 0.1, and most preferably not more than 0.05. If the above-mentioned range is exceeded, weather resistance may be reduced. By adding the hindered phenol compound within the above-mentioned range, the value of the TOD can be adjusted. The lower limit of the TOD is 0 in principle.

3. Film Resin Composition

For the film resin composition that forms the film, an ultraviolet ray absorber; organic and inorganic particles as a lubricant; white and black pigments such as titanium oxide, barium sulfate and carbon black; and so on may be additionally added.

Particularly, addition of particles as a lubricant of the film is a preferred mode in a catalyst system in which no internal particles are generated. Examples of the particles include particles formed of an organic polymer such as crosslinked polyvinylbenzene, acrylic, crosslinked polystyrene, polyester, polyimide, polyamide and fluororesin; and inorganic particles such as colloidal silica, titanium oxide, aluminum oxide, zirconium oxide, calcium carbonate, carbon black and zeolite. The average particle diameter of the particles is preferably 0.05 to 5 μm as measured by a Coulter counter method. The added amount thereof is preferably 0.01 to 2% by mass.

These particles and pigments may be added during the polycondensation step or may be added as a master batch during film formation. When high weather resistance is required, they are preferably added during the polycondensation step.

4. Production of Film

The film of the present invention may be any of a non-drawn film, a uniaxially drawn film and a biaxially drawn film. Particularly a biaxially drawn film is preferable from the viewpoints of durability and mechanical strength.

In the case of an oriented polyester film, it is desirable that the film is produced through a melting step of melting in an extruder polyester chips polymerized using the specific catalyst; a film forming step of forming a non-drawn film by extruding the molten resin from the extruder; a drawing step of drawing the non-drawn film at least in one direction; and a heat setting step of heat-treating the drawn film.

A method for producing the oriented polyester film of the invention of the present application will now be described in detail.

In the melting step, a raw material is fed into a melt extruder, and melted by heating to a temperature that is not lower than the polymer melting point. At this time, a sufficiently dried raw material is preferably used for suppressing an increase in the carboxyl terminal concentration during production of the film. The moisture content of the raw material is preferably not more than 100 ppm, more preferably not more than 50 ppm, further preferably not more than 30 ppm, and especially preferably not more than 20 ppm. For the drying method, a known method such as heating or drying under a reduced pressure can be used.

The maximum temperature of the resin within the extruder is preferably not lower than 280° C., more preferably not lower than 285° C., and further preferably not lower than 287° C. By increasing the melting temperature, the back pressure during filtration within the extruder is reduced, leading to the improvement in productivity. The maximum temperature of the resin within the extruder is preferably not higher than 310° C., more preferably not higher than 305° C., and further preferably not higher than 300° C. If the melting temperature increases, thermal degradation of the polyester proceeds, and the carboxyl terminal concentration of the polyester increases, so that hydrolysis resistance is reduced in some cases. A method is also preferable in which a resin is extruded while being degassed using an extruder equipped with a vent. It is also preferable to design an apparatus so that the time during which a resin is in a molten state (from the interior of an extruder to a die tip) is as short as possible. The retention time in a molten state is preferably not more than 30 minutes, further preferably not more than 20 minutes, and especially preferably not more than 15 minutes.

Since the polyester resin composition contains a hindered phenol structure, decomposition by heat in the extruder can be effectively suppressed to inhibit acid-value increase.

When no hindered phenol is contained, acid-value increase in the extruder varies depending on the molecular weight and dried state of a polyester used, and kneading conditions. For example, in the case of a raw material polyester having an IV of about 0.75 dL/g, the acid value is increased by about 6 to 7 eq/ton even though sufficient drying is performed, but when the hindered phenol is contained within the range of the present invention, acid-value increase can be suppressed to not more than about 4 eq/ton. The degree of suppression seems slight, but since hydrolysis of the polyester is exponentially decomposed while a generated acid serves as a catalyst, ability of suppressing the initial acid value has a very significant effect for retaining weather resistance. Further, not only acid-value increase but also molecular-weight reduction (IV reduction) can be suppressed, and a raw material polyester having a lower molecular weight can be used when producing a film having a desired molecular weight. Consequently, the resin temperature during film formation can be lowered, and moreover acid-value increase due to decomposition can be suppressed. Owing to such synergy effects, a polyester film that is quite excellent in weather resistance can be obtained. Such an excellent effect is obtained even when the added amount of the hindered phenol is smaller than that of the hindered phenol which has been previously normally used.

In the film forming step, the molten resin is extruded from a T die onto a cooling rotating roll to be molded into a sheet, so that a non-drawn film is prepared. At this time, high-speed film formability can be achieved by applying the techniques described in JP-B-06-39521 and JP-B-06-45175. Also, using a plurality of extruders, a laminated film may be formed by a co-extrusion method while assigning various functions to a core layer and a skin layer.

In the drawing step, the polyester film of the present invention can be obtained by drawing a film at least uniaxially at a ratio of 1.1 to 6 at a temperature that is not lower than the glass transition temperature and lower than the crystallization temperature of the polyester by using a known method.

For example, when a biaxially oriented polyester film is produced, the following methods can be employed: a sequential biaxial drawing method in which a film is uniaxially drawn in a longitudinal or lateral direction, and then drawn in a perpendicular direction; a simultaneous biaxial drawing method in which a film is drawn in longitudinal and lateral directions simultaneously; and a method in which a linear motor is used as driving means for performing simultaneous biaxial drawing.

Further, after completion of drawing, it is preferable to carry out a heat setting treatment at a temperature of from (melting point −50° C.) to a temperature lower than the melting point for not more than 30 seconds, preferably for not more than 10 seconds in the heat setting step, and perform a longitudinal relaxation treatment and lateral relaxation treatment at 0.5 to 10%, or the like for reducing the thermal shrinkage coefficient of the film.

When a higher level of heat dimensional stability is required as a polyester film for a solar cell, it is desirable to perform a longitudinal relaxation treatment. As a longitudinal relaxation treatment method, a known method can be used. For example, a method of performing a longitudinal relaxation treatment by gradually narrowing clip gaps of a tenter (JP-B-4-028218) or a method of performing a relaxation treatment by avoiding influences of clips by contacting the film with a razor blade at the edge to be cut within a tenter (JP-B-57-54290) can be used.

The thermal shrinkage coefficient in longitudinal and lateral directions is in a range of preferably 0 to 4.0%, further preferably 0.2 to 3.0%, and especially preferably 0.3 to 2.5%. If the thermal shrinkage coefficient is a negative value, there arises a problem that the film is warped during film processing. If the thermal shrinkage coefficient is more than 4.0%, shrinkage at the time of film processing is large, thus being not preferable.

The thickness of the obtained polyester film for a solar cell is preferably 10 to 500 μm, more preferably 15 to 400 μm, and further preferably 20 to 300 μm. If the thickness is less than 10 μm, the film lacks firmness, and is therefore difficult to handle. On the other hand, if the thickness is more than 500 μm, handling characteristics are reduced, so that handling becomes difficult.

For imparting various functions such as adhesiveness, insulation properties and scratch resistance, the surface of the polyester film is coated with a polymer resin by using coating methods. Inorganic and/or organic particles may be included only in a coating layer to form an easy-slip polyester film. Further, an inorganic deposited layer or an aluminum layer may be provided on the polyester film to impart a water-vapor barrier function.

The polyester film preferably has concave and convex formed on the film surface for improving handling characteristics such as slippage, mobility, abrasion resistance and a winding characteristic. Examples of the method for providing concave and convex on the film surface include, in addition to the aforementioned method of using particles, a method of performing embossing by a roll provided with concave and convex on the surface of a thin film, and a method of patterning concave and convex on the film surface by laser beams or the like.

Further, a method, in which a laminated structure is formed, and inert particles are not included in a polyester layer as a central layer, but the particles are included only in a surface layer, is also a very effective method for reducing the haze.

5. Production of Void-Containing White Film

When high light reflectivity is imparted to the film, it is also preferable to form a white film. In this case, one containing a large number of fine voids therein is preferable because it has high reflectivity even to light in a near-infrared range. The apparent specific gravity in this case is preferably not less than 0.7 and not more than 1.3, more preferably not less than 0.9 and not more than 1.3, and further preferably not less than 1.05 and not more than 1.2. If the apparent specific gravity is less than 0.7, the film lacks firmness, and is therefore difficult to process during preparation of a solar cell module. Even if a film having an apparent specific gravity of more than 1.3 is within the scope of the present invention, it may possibly present an obstacle in the way of reducing the weight of the solar cell because of the large mass of the film.

The above-mentioned fine voids can be formed in association with the aforementioned fine particles and/or a thermoplastic resin incompatible with a polyester as described later. The void associated with fine particles or a thermoplastic resin incompatible with a polyester refers to the presence of voids around the aforementioned fine particles or the aforementioned thermoplastic resin. The voids can be confirmed with, for example, a section photograph of a film by an electron microscope, or the like.

The thermoplastic resin incompatible with a polyester is not particularly limited. Specific examples include polystyrene-based resins, polyolefin-based resins, polyacryl-based resins, polycarbonate-based resins, polysulfone-based resins and cellulose-based resins. Particularly, polystyrene-based resins or cyclic polyolefin-based resins, and polyolefin-based resins such as polymethylpentene and polypropylene are suitably used.

A mixing ratio of the void forming agent, i.e. the thermoplastic resin incompatible with a polyester, to the polyester resin composition varies depending on the intended amount of voids. The mixing ratio is preferably 3 to 20% by mass, and further preferably 5 to 18% by mass based on the total film. If the mixing ratio is less than 3% by mass, the increasing of formation of voids is limited. Conversely, if the mixing ratio is not less than 20% by mass, the drawability of the film is significantly deteriorated, and heat resistance, strength and firmness are deteriorated, thus not being preferable.

The void-containing white film may have a single layer or a laminated structure composed of two or more layers. As the laminated structure, a void-containing white film which has a skin layer including a polyester layer containing white fine particles having an average particle diameter of 0.1 to 3 μm and a core layer including a polyester layer containing a large number of voids associated with a thermoplastic resin incompatible with a polyester, is also a preferred aspect of the present invention. The method for production thereof is arbitrary, and is not particularly limited, but for example, the void-containing white film can be produced in the following manner. First, as a method for bonding a skin layer to the film surface, it is most preferable to employ a co-extrusion method in which a polyester resin for a skin layer containing fine particles and a polyester resin for a core layer containing an incompatible with a thermoplastic resin are fed into separate extruders, then laminated in a molten state, and extruded from the same die.

Examples of the white fine particles include calcium carbonate, titanium oxide, zinc oxide, lead carbonate and barium sulfate. Particularly, titanium oxide and barium sulfate are preferable. The white fine particles are preferably added as a master batch because the added amount thereof is large, i.e., 5 to 20% by mass based on the polyester resin composition.

Each of raw materials is mixed, and the mixture is introduced into an extruder, melted, extruded from a T-die, and brought into close contact with a cooling roll to obtain a non-drawn sheet. Further, the non-drawn sheet is subjected to a biaxial orientation treatment by drawing between rolls different in speed (roll drawing); drawing by expanding a film with the film held by clips (tenter drawing); drawing by expanding a film using a pneumatic pressure (inflation drawing); or the like. By carrying out the orientation treatment, interfacial peeling occurs between the polyester and the incompatible thermoplastic resin and between the polyester and the fine particles, so that a large number of fine voids are generated. Therefore, conditions for drawing/orientation-treating the non-drawn sheet are closely related to generation of voids.

First, the longitudinal drawing step in the first stage is the most important process for forming a large number of fine voids within the film. Longitudinal drawing is drawn between two or multiple rolls different in circumferential speed. Heating means at this time may be a method using a heating roll or a method using a non-contact heating method, or these methods may be used in parallel. Among them, the most preferable drawing method is a method using roll heating and non-contact heating. In this case, first a film is preliminarily heated to a temperature of from 50° C. to a temperature that is not higher than the glass transition temperature of a polyester, and then heated by an infrared heater.

Then, the uniaxially drawn film thus obtained is introduced into a tenter, and drawn in a width direction at a ratio of 2.5 to 5. The preferred drawing temperature at this time is 100° C. to 200° C. The biaxially drawn film thus obtained is subjected to a heat treatment as necessary. The heat treatment is carried out preferably within a tenter, and preferably at a temperature in a range of from the melting point (Tm) of the polyester −50° C. to the melting point (Tm).

The film thus obtained has a whiteness degree of preferably not less than 50, more preferably not less than 60, and further preferably not less than 70.

In the case of such a void-containing film and a film containing not less than 5% by mass of a pigment, it may be difficult to make the acid value of the polyester, which forms the film, comparable to that of a film required to have high weather resistance, because it is necessary to intensify kneading conditions or use a large amount of a master batch. In this case, the acid value of the polyester that forms the film is preferably less than 25 eq/ton, more preferably less than 22 eq/ton, further preferably less than 20 eq/ton, and especially preferably less than 18 eq/ton.

When a co-extruded laminated film as described above is formed with a film required to have high weather resistance, a white film or the like, the thickness of a layer formed of a polyester resin composition containing a hindered phenol structure is preferably not less than 50%, further preferably not less than 65%, and especially preferably not less than 70% with respect to the thickness of the total film. If the thickness of the layer containing a hindered phenol structure is less than the above-mentioned range, a layer having no hindered phenol structure is degraded to cause cracks or the like when the film is stretched, and even the layer having a hindered phenol structure may be broken under the influence of the cracks or the like. The layer having no hindered phenol structure may be cracked minutely and whitened to deteriorate the outer appearance. All the layers are preferably layers formed of the polyester resin composition containing a hindered phenol structure.

The polyester film of the present invention has high weather resistance, and can be used in various applications that require weather resistance, particularly hydrolysis resistance. Examples of specific applications include those of a front sheet (light receiving surface) and back sheet (opposite to the light receiving surface) of a solar cell, motor insulation, and a capacitor, and particularly the polyester film is suitably used for the back sheet of the solar cell.

When the polyester film is used for the back sheet of the solar cell, it is laminated with, for example, a gas barrier layer and a light reflection layer to form a back sheet. For lamination, a laminate adhesive such as a urethane-based adhesive can be used. It is preferable to subject the surface of the film of the present invention to easy-adhesion coating.

The polyester film of the present invention can also be used as a weather-resistant gas barrier film by depositing thereon aluminum or an inorganic oxide. When it is formed as a white film or a void-containing film, it can be used as a weather-resistant light-reflective film. In these cases, the number of laminated layers of the back sheet can be decreased, thus making it possible to reduce the cost and weight of the solar cell.

The solar cell back sheet prepared by laminating the polyester films of the present invention in this way can be formed into a solar cell module by packing an electromotive cell of silicon or the like between the sheet and a transparent surface base material via a filler such as an ethylene vinyl acetate copolymer.

When the polyester film of the present invention is used for the front sheet of the solar cell, provision of an antireflection layer and a hard coat layer is also a preferred mode.

The polyester film for electrical insulation is a single-layer or multilayered film or sheet that is used for applications of insulation of electronic members. The polyester film of the present invention has high durability and heat resistance, and is therefore suitable as a base film, for example, for an electrical insulation strap for the interior and exterior of a capacitor, or a motor, a flexible print wiring board, a transformer, a cable, a generator and the like.

EXAMPLES

The present invention will be described more specifically below by way of Examples, but the present invention is not limited by Examples described below, and can be implemented while being appropriately modified within the bounds of not departing from the aforementioned and below-mentioned teachings, and these modifications are all encompassed within the technical scope of the present invention.

(1) Content of Hindered Phenol Structure in Film Composition

In Examples, the content was calculated from the amount of a hindered phenol added during polymerization or as a master batch.

For example, when Irganox (registered trademark) 1330 was added at the start of polycondensation in an amount of 200 ppm based on the mass of a resin after polymerization, the content thereof is as follows: 200/775.2 (molecular weight of Irganox (registered trademark) 1330)×3 (number of hindered phenol structures per molecule of Irganox (registered trademark) 1330)=0.77.

(2) Intrinsic Viscosity (IV) of Polyester

A sample was crushed, dried, and then dissolved in a mixed solvent of phenol/1,1,2,2-tetrachloroethane (6/4 (mass ratio)). The solution was subjected to a centrifugal separation treatment to remove inorganic particles and unnecessary substances (void forming agent in the case of a void-containing film), followed by making a measurement at 30° C. using an Ubbelohde viscometer. Calculation was performed with the mass of only a polyester by subtracting the mass of components other than the polyester from the mass of the sample.

(3) Content of Diethylene Glycol (DEG Content)

The polyester (0.1 g) was decomposed by heating in 2 ml of methanol at 250° C., followed by performing quantification by gas chromatography to determine a DEG content.

(4) Method for Measurement of Acid Value

A. Preparation of Sample

A sample was crushed, dried under vacuum at 70° C. for 24 hours, and then weighed to 0.20±0.0005 g using a balance. The mass at this time was designated as W (g). Benzyl alcohol (10 ml) and the weighed sample were added in a test tube, the test tube was immersed in a benzyl alcohol bath heated to 205° C., and the sample was dissolved with stirring by a glass rod. Samples with the dissolution time of 3 minutes, 5 minutes and 7 minutes were designated as A, B and C, respectively. Then, a test tube was newly provided, only benzyl alcohol was added therein, a treatment was carried out in the same procedure as described above, and samples with the dissolution time of 3 minutes, 5 minutes and 7 minutes were designated as a, b and c, respectively.

B. Titration

Titration was performed using 0.04 mol/l of an aqueous potassium hydroxide solution (ethanol solution), the factor of which is known in advance. A titer (ml) of the aqueous potassium hydroxide solution was determined by using phenol red as an indicator and considering as an end point a point at which the color of the solution was changed from yellowish green to pink. The titers of samples A, B and C are designated as XA, XB and XC (ml), respectively. The titers of samples a, b and c are designated as Xa, Xb and Xc (ml), respectively.

C. Calculation of Acid Value

Using titers XA, XB and XC for the respective dissolution times, a titer V (ml) at a dissolution time of 0 minute was determined by a least square method. Similarly, a titer V0 (ml) was determined using Xa, Xb and Xc. Then, a carboxyl terminal concentration was determined in accordance with the following equation.

$$\text{Acid value(eq/ton)} = [(V-V0) \times 0.04 \times NF \times 1000]/W$$

NF: factor of 0.04 mol/l of aqueous potassium hydroxide solution

W: sample mass (g)

When components other than the polyester as in the case of a void-containing film are included, W is a mass of only the polyester which is obtained by subtracting the mass of components other than the polyester from the total mass.

(5) Content of Cyclic Trimer (Hereinafter Referred to as "CT Content")

A sample was dissolved in a mixed liquid of hexafluoroisopropanol/chloroform, and diluted by further adding chloroform. Methanol is added thereto to precipitate a polymer, followed by carrying out filtration. The filtrate was evaporated to dryness, the volume was made constant with dimethylformamide, and a cyclic trimer formed of ethylene terephthalate units was quantified by a liquid chromatography method.

(6) Content of Acetaldehyde (Hereinafter Referred to as "AA Content")

Sample/distilled water (=1 gram/2 ml) was placed in a glass ampule replaced with nitrogen, the top of the ampule was sealed, an extraction treatment was carried out at 160° C. for 2 hours, acetaldehyde in the extract was measured by high-sensitive gas chromatography after cooling, and the concentration was expressed in ppm.

The AA contents of films of Examples and Comparative Examples were in a range of 15 to 23 ppm.

(7) Thermal-Oxidative Decomposition Parameter (TOD)

A film ([IV]i) was frozen and crushed into a powder of not more than 20 mesh. The powder was dried under vacuum at 130° C. for 12 hours, and 300 mg of the powder was placed in a glass test tube having an inner diameter of about 8 mm and a length of about 140 mm, and dried under vacuum at 70° C. for 12 hours. Then, the test tube was immersed in a salt bath at 230° C. under air dried by attaching to the top of the test tube a drying tube containing silica gel, and heated for 15 minutes, and thereafter [IV]f1 was measured.

The TOD was determined in the following manner. It is to be noted that [IV]i and [IV]f1 represent IV (dL/g) before and after the heating test, respectively. Freezing and crushing were carried out using a freezer mill (Model 6750 manufactured by SPEX CentriPrep in U.S.A.). About 2 g of resin chips or a film and a special impactor were placed in a special cell, the cell was thereafter set in a device, the device was filled with liquid nitrogen, and retained for about 10 minutes, and the crushing was then carried out for 5 minutes at RATE 10 (the impactor is reciprocated about 20 times per second).

$$TOD = 0.245\{[IV]f1^{(-1.47)} - [IV]i^{(-1.47)}\}$$

(8) Moisture Content of Polyester Chips

Chips (1 to 2 g) were heat-treated under conditions of 230° C. and 10 minutes to volatilize moisture contained in chips, and the moisture content was measured using a moisture content measuring device (Model VA-05 manufactured by Mitsubishi Kasei Corporation).

(9) Evaluation of Hydrolysis Resistance (Fracture Elongation Retention)

As evaluation of hydrolysis resistance, a HAST (Highly Accelerated temperature and humidity Stress Test) standardized in JIS C-60068-2-66 was conducted. The test was conducted under conditions of 105° C., 100% RH and 0.03 MPa using EHS-221 manufactured by ESPEC CORP for the instrument.

A film was cut into 70 mm×190 mm, and the film was placed using a jig. The films were placed while keeping such a distance that they did not contact one another. A treatment was carried out under conditions of 105° C., 100% RH and 0.03 MPa for 200 hours and 300 hours. Fracture elongations before and after the treatment were measured in accordance with JIS C-2318-1997 5.3.31 (tensile strength and elongation), and a fracture elongation retention was calculated in accordance with the following equation.

$$\text{Fracture elongation retention(\%)} = [(\text{fracture elongation(\%) after treatment})/(\text{fracture elongation(\%) before treatment})] \times 100$$

(10) Fracture Elongation Retention Half Life of Heat Resistance Test at 160° C.

A film was cut out in a longer direction into a strip sample having a length of 200 mm and a width of 10 mm, and used. A fracture elongation was measured at 25° C. and 65% RH using a tensile test device in accordance with a method specified in JISK-7127. The initial tensile chuck-to-chuck distance was 100 mm, and the tensile speed was 300 m/minute. Measurements were made 20 times with the sample changed from one to another, and an average value (X) of fracture elongations thereof was determined. A strip sample having a length of 200 mm and a width of 10 mm was placed in a gear oven, left standing under an atmosphere at 160° C., and then naturally cooled, and for this sample, a tensile test was conducted 20 times under the same conditions as described above, and an average value (Y) of fracture elongations thereof was determined. A fracture elongation retention was determined by the following equation from the average values (X) and (Y) of fracture elongations obtained.

$$\text{Fracture elongation retention(\%)} = (Y/X) \times 100$$

The heat treatment time taken until the fracture elongation retention was not more than 50% was determined, and designated as a fracture elongation retention half life.

(11) Content (ppm) of Metal Element and Content (ppm) of Phosphorus Element

A sample was incinerated/acid-dissolved, followed by determining the content by high-frequency plasma emission spectrometry or atomic absorption spectroscopy.

(12) Apparent Specific Gravity

A film was accurately cut out into a square of 10 cm×10 cm, the thickness thereof was measured at 50 points, and an average thickness t (unit: μm) was determined. Next, the mass of the sample was measured to 0.1 mg, and the measured value was designated as w (unit: g). Then, the apparent specific gravity was calculated by the following equation.

Apparent specific gravity(-)=(w/t)×10000

(13) Whiteness Degree

A measurement was made using Z-1001DP manufactured by NIPPON DENSHOKU INDUSTRIES CO., LTD. in accordance with the JIS-L1015-1981-B method for the whiteness degree.

(14) Contamination of Die Lip, Roll and the Like

Degrees of contamination of the periphery of a die lip, a cooling roll, a conveyance roll at each position and a drawing roll after film formation were visually observed, and evaluations were made in three grades of A, B and C.

A: Comparable to a polyester containing no hindered phenol.

B: There is a slight increase in deposits on the periphery of a lip, or a part of the roll is slightly clouded.

C: Operability may be deteriorated because there is an apparent increase in deposits on the periphery of a lip, a roll is clouded, or the like.

(15) Content of Acid Components Other than Terephthalic Acid Component and Glycol Components Other than Ethylene Glycol Component A measurement was made by adjusting the composition of a copolymerization monomer so as to have a predetermined copolymerization ratio during polymerization. The obtained polyester was dissolved in a mixed solvent of heavy chloroform:trifluoroacetic acid=9:1 (volume ratio), and a measurement was made by $^1$H-NMR (NMR, AVANCE 500 manufactured by BRUKER Corporation) to confirm that predetermined amounts of components were copolymerized.

(16) Thermal Shrinkage Coefficient of Film at 150° C. (HS150)

A film was cut into a size of 10 mm in width and 250 mm in length along such a direction that longer sides (250 mm) each coincided with the longer direction and the width direction, the film was marked at an interval of 200 mm, and an interval A was measured under a fixed tension of 5 g. Subsequently, the film was left standing in an oven in an atmosphere of 150° C. for 30 minutes under no-load. The film was taken out from the oven and cooled to room temperature, a marked interval B was determined under a fixed tension of 5 g, and a thermal shrinkage coefficient was determined by the following equation.

The thermal shrinkage coefficient of the film at 150° C. was measured at intervals of 100 mm in the film width direction, average values for 3 samples were rounded off to two decimal places, and a value in one of the longer direction and the width direction, which had a greater value, was used.

Thermal shrinkage coefficient(%)=[(A-B)/A]×100

Examples 1 to 3

Magnesium acetate tetrahydrate was added into a mixture of terephthalic acid and ethylene glycol so that the concentration in a polyester was 120 ppm in terms of a Mg atom, and the mixture was reacted at a temperature of 255° C. at normal pressure. Thereafter, thereto were further added antimony trioxide in such an amount that the concentration in the polyester was 250 ppm in terms of an Sb atom, cobalt acetate tetrahydrate in such an amount that the concentration in the polyester was 30 ppm in terms of a Co atom and trimethyl phosphate in an such an amount that the concentration in the polyester was 150 ppm in terms of a P atom, and the mixture was further reacted at a temperature of 260° C.

Subsequently, the reaction product was transferred to a polycondensation reaction tank, and a hindered phenol compound (Irganox 1330) in an amount shown in Table 1 and silica particles having an average particle diameter of 1.0 μm were added so that the concentration in the polyester was 800 ppm. Then, the reaction system was gradually decompressed while elevating the temperature by heating, and polymerized at 290° C. under a reduced pressure of 133 Pa (1 mmHg) using conventional methods, to obtain chips having an IV of 0.60 dL/g. Subsequently, using a rotation-type vacuum polymerization apparatus, solid phase polycondensation was conducted at 220° C. under a reduced pressure of 67 Pa (0.5 mmHg) to obtain a resin composition having an intrinsic viscosity of 0.76 dL/g and an acid value of 5 eq/ton. The content of a cyclic trimer (CT) was 0.29% by mass.

Chips of the polyester resin composition obtained was dried to a moisture content of 17 ppm, fed into an extruder, and extruded in a sheet form from a die while the resin maximum temperature in an extruder melting part, a kneading part, a polymer tube, a gear pump and a filter was set at 290° C. and the resin maximum temperature in subsequent polymer tubes was set at 285° C. These polymers were each filtered using a filter medium of a stainless sintered body (nominal filtration accuracy: 20 μm particle 95% cut). A flat die was set so that the resin temperature was 285° C. The extruded resin was wound around a casting drum having a surface temperature of 30° C., and solidified by cooling to prepare a non-drawn film.

Next, the non-drawn film was heated to 100° C. with a group of heated rolls and an infrared heater, and thereafter drawn at a ratio of 3.3 in a longer direction by a group of rolls having a difference in circumferential speed, so that a uniaxially oriented PET film was obtained. Subsequently, the uniaxially oriented PET film was drawn at a ratio of 4.0 in a width direction at 130° C. in a tenter, heat-set at 235° C., and further subjected to a relaxation treatment at 200° C. in the width direction to obtain a biaxially oriented PET film having a thickness of 50 μm.

The results are shown in Table 1.

TABLE 1

| | Example 1 | Example 2 | Example 3 |
|---|---|---|---|
| Hindered phenol compound | IRG1330 | IRG1330 | IRG1330 |
| Content of Hindered phenol compound (ppm) | 30 | 100 | 200 |
| Content of Hindered phenol structure (eq/ton) | 0.12 | 0.39 | 0.77 |
| Content of DEG (mol % in glycol) | 1.2 | 1.2 | 1.2 |
| IV of film (dL/g) | 0.71 | 0.73 | 0.73 |
| IV of raw material PET (dL/g) | 0.76 | 0.76 | 0.76 |
| AV of film (eq/ton) | 9 | 8 | 8 |
| AV of raw material PET (eq/ton) | 5 | 5 | 5 |
| Content of CT in film (% by mass) | 0.4 | 0.4 | 0.4 |
| Kind of Catalyst | Sb | Sb | Sb |
| TOD | 0.25 | 0.04 | 0.01 |
| Result of HAST test (105° C., 300 hr, %) | 70 | 88 | 92 |
| Fracture elongation retention half life at 160° C. (hr) | 800 | 1000 | 1000 |
| Contamination of die lip, roll and the like | A | A | A |

IRG1330: Irganox 1330, manufactured by BASF Japan Ltd.

Examples 4 to 10 and Comparative Examples 1 to 2

Chips of the polyester resin composition obtained by solid phase polymerization having an IV of 0.76 dL/g and an acid value of eq/ton was obtained in the same manner as in Example 1, except that a hindered phenol compound was not added. The Chips was dried to a moisture content of 15 ppm, The results are shown in Table 2. Although the intrinsic viscosity of film was the same as those of Examples, the high temperature was required in film formation step since it was necessary to increase the intrinsic viscosity of a raw material polyester. As a result, decomposition was processed, and the acid value of the film was increased, leading to poor weather resistance.

TABLE 2

|  | Example 4 | Example 5 | Example 6 | Example 7 | Example 8 | Example 9 | Example 10 | Comparative Example 1 | Comparative Example 2 | Comparative Example 3 |
|---|---|---|---|---|---|---|---|---|---|---|
| Hindered phenol compound | IRG1330 | IRG1330 | IRG1330 | IRG1330 | IRG1330 | IRG1330 | IRG1330 | IRG1330 | IRG1330 | — |
| Content of Hindered phenol compound (ppm) | 15 | 30 | 60 | 200 | 400 | 700 | 1200 | 5 | 2200 | 0 |
| Content of Hindered phenol structure (eq/ton) | 0.06 | 0.12 | 0.23 | 0.77 | 1.55 | 2.71 | 4.6 | 0.02 | 8.51 | 0 |
| Content of DEG (mol % in glycol) | 1.2 | 1.2 | 1.2 | 1.2 | 1.2 | 1.2 | 1.2 | 1.2 | 1.2 | 1.2 |
| IV of film (dL/g) | 0.71 | 0.72 | 0.73 | 0.73 | 0.73 | 0.73 | 0.73 | 0.69 | 0.73 | 0.73 |
| IV of raw material PET (dL/g) | 0.76 | 0.76 | 0.76 | 0.76 | 0.76 | 0.76 | 0.76 | 0.76 | 0.76 | 0.81 |
| AV of film (eq/ton) | 9 | 8 | 8 | 8 | 8 | 8 | 8 | 12 | 9 | 16 |
| AV of raw material PET (eq/ton) | 5 | 5 | 5 | 5 | 5 | 5 | 5 | 5 | 5 | 4 |
| Content of CT in film (% by mass) | 0.4 | 0.4 | 0.4 | 0.4 | 0.4 | 0.4 | 0.4 | 0.4 | 0.4 | 0.4 |
| Kind of Catalyst | Sb | Sb | Sb | Sb | Sb | Sb | Sb | Sb | Sb | Sb |
| TOD | 0.23 | 0.1 | 0.01 | 0.01 | 0.01 | 0.01 | 0.01 | 0.3 | 0.01 | 0.38 |
| Result of HAST test (105° C., 300 hr, %) | 70 | 85 | 90 | 93 | 91 | 93 | 93 | 60 | 90 | 60 |
| Fracture elongation retention half life at 160° C. (hr) | 750 | 900 | 1000 | 1200 | 1100 | 1200 | 1300 | 600 | 1000 | 600 |
| Contamination of die lip, roll and the like | A | A | A | A | A | A | A to B | A | B | A |

IRG1330: Irganox 1330, manufactured by BASF Japan Ltd.

dried chips and a hindered phenol compound were fed into a biaxial extruder, and melted and kneaded under reduction of pressure with a vent to obtain a master batch containing a hindered phenol compound of 50000 ppm.

The obtained chips of a solid phase polymerized polyester and a master batch containing a hindered phenol compound were dried to a moisture content of 17 ppm, and film formation was carried out in the same manner as in Example 1, to prepare a film. The results are shown in Table 2.

From the results of Examples 4 to 10 and Comparative Examples 1 and 2, it was found that deterioration of film during film formation was suppressed by increase of hindered phenol structures and weather resistance was improved. In addition, in Comparative Example 2, there were a few of attached substances on die lip parts and chill roll parts.

Comparative Example 3

Polycondensation reaction was carried out in the same manner as in Examples 1 to 3, except that a hindered phenol compound was not added during polycondensation and the time of solid phase polymerization was lengthened, to obtain chips of a solid phase polymerized polyester resin composition. In addition, PET film was produced in the same manner as in Example 1 and the temperature was controlled such that the pressure of a polyester resin in each of film formation steps was comparable to that of Example 3. Specifically, the resin maximum temperature in an extruder melting part, a kneading part, a polymer tube, a gear pump and a filter was set at 300° C. and the resin maximum temperature in subsequent polymer tubes was set at 290° C.

Examples 11 and 12

Examples 11 and 12 were carried out in the same manner as in Example 1 except that the added hindered phenol compound and the added amount were changed. The results are shown in Table 3.

Example 13

A polyester having an IV of 0.55 dL/g was produced by melt polymerization and was solid phase polymerized to obtain chips of a solid phase polymerized polyester resin composition having an IV of 0.68 dL/g and an acid value of 6 eq/ton. The others were carried out in the same manner as in Example 3.

PET film was produced in the same manner as in Example 3, but the temperature was controlled such that the pressure of a polyester resin in each of film formation steps was comparable to that of Example 3. Specifically, the resin maximum temperature in an extruder melting part, a kneading part, a polymer tube, a gear pump and a filter was set at 288° C. and the resin maximum temperature in subsequent polymer tubes was set at 285° C. The results were good level, but weather resistance was inferior to that of Example 3 due to low molecular weight. The results are shown in Table 3.

Example 14

Polycondensation reaction was carried out in the same manner as in Example 3 except that the time of solid phase polymerization was lengthened, to obtain chips of a solid phase polymerized polyester resin composition. In addition, PET film was produced in the same manner as in Example 3 and the temperature was controlled such that the pressure of a polyester resin in each of film formation steps was comparable to that of Example 3. Specifically, the resin maximum temperature in an extruder melting part, a kneading part, a polymer tube, a gear pump and a filter was set at 305° C. and the resin maximum temperature in subsequent polymer tubes was set at 290° C. Although the acid value was slightly high, weather resistance was excellent since molecular weight was maintained. The results are shown in Table 3.

Comparative Example 4

A polyester having an IV of 0.68 dL/g was produced by melt polymerization and was solid phase polymerized to obtain chips of a solid phase polymerized polyester resin composition having an IV of 0.76 dL/g and an acid value of 23 eq/ton. The others were carried out in the same manner as in Example 3.

The results are shown in Table 3. Although hindered phenol structures were contained, the acid value was high and weather resistance was poor.

Comparative Example 5

A polyester having an IV of 0.52 dL/g was produced by melt polymerization and was solid phase polymerized to obtain chips of a solid phase polymerized polyester resin composition having an IV of 0.64 dL/g and an acid value of 5 eq/ton. The others were carried out in the same manner as in Example 3.

The results are shown in Table 3. Although hindered phenol structures were contained, the intrinsic viscosity was low and weather resistance was poor.

Examples 15 to 18

Examples 15 to 18 were carried out in the same manner as in Example 4 except that a master batch was produced from a hindered phenol compound shown in Table 4 and the added amount of a hindered phenol compound was changed during film formation. The similar effects were found in the case where the hindered phenol compound was changed.

TABLE 4

|  | Example 15 | Example 16 | Example 17 | Example 18 |
|---|---|---|---|---|
| Hindered phenol compound | IRG1222 | IRG1222 | IRG1010 | IRG1010 |
| Content of Hindered phenol compound (ppm) | 100 | 200 | 100 | 200 |
| Content of Hindered phenol structure (eq/ton) | 0.28 | 0.56 | 0.34 | 0.68 |
| Content of DEG (mol % in glycol) | 1.2 | 1.2 | 1.2 | 1.2 |
| IV of film (dL/g) | 0.73 | 0.73 | 0.73 | 0.73 |
| IV of raw material PET (dL/g) | 0.76 | 0.76 | 0.76 | 0.76 |
| AV of film (eq/ton) | 8 | 8 | 8 | 8 |
| AV of raw material PET (eq/ton) | 5 | 5 | 5 | 5 |
| Content of CT in film (% by mass) | 0.4 | 0.4 | 0.4 | 0.4 |
| Kind of Catalyst | Sb | Sb | Sb | Sb |
| TOD | 0.01 | 0.01 | 0.01 | 0.01 |
| Result of HAST test (105° C., 300 hr, %) | 92 | 92 | 92 | 90 |
| Fracture elongation retention half life at 160° C. (hr) | 1000 | 1000 | 1000 | 1100 |
| Contamination of die lip, roll and the like | A | A | A | A |

IRG1222: Irganox 1222, manufactured by BASF Japan Ltd.
IRG1010: Irganox 1010, manufactured by BASF Japan Ltd.

TABLE 3

|  | Example 11 | Example 12 | Example 13 | Example 14 | Comparative Example 4 | Comparative Example 5 |
|---|---|---|---|---|---|---|
| Hindered phenol compound | IRG1098 | IRG1098 | IRG1330 | IRG1330 | IRG1330 | IRG1330 |
| Content of Hindered phenol compound (ppm) | 100 | 200 | 200 | 200 | 200 | 200 |
| Content of Hindered phenol structure (eq/ton) | 0.31 | 0.63 | 0.77 | 0.77 | 0.77 | 0.77 |
| Content of DEG (mol % in glycol) | 1.2 | 1.2 | 1.2 | 1.2 | 1.2 | 1.2 |
| IV of film (dL/g) | 0.73 | 0.73 | 0.67 | 0.8 | 0.73 | 0.62 |
| IV of raw material PET (dL/g) | 0.76 | 0.76 | 0.68 | 0.85 | 0.76 | 0.64 |
| AV of film (eq/ton) | 8 | 8 | 8 | 11 | 27 | 7 |
| AV of raw material PET (eq/ton) | 5 | 5 | 6 | 4 | 23 | 5 |
| Content of CT in film (% by mass) | 0.4 | 0.4 | 0.4 | 0.35 | 0.9 | 0.4 |
| Kind of Catalyst | Sb | Sb | Sb | Sb | Sb | Sb |
| TOD | 0.04 | 0.01 | 0.01 | 0.01 | 0.01 | 0.01 |
| Result of HAST test (105° C., 300 hr, %) | 91 | 94 | 86 | 88 | 20 | 50 |
| Fracture elongation retention half life at 160° C. (hr) | 1000 | 1100 | 1000 | 1100 | 800 | 600 |
| Contamination of die lip, roll and the like | A | A | A | A | A | A |

IRG1098: Irganox 1098, manufactured by BASF Japan Ltd.
IRG1330: Irganox 1330, manufactured by BASF Japan Ltd.

Example 19 and Comparative Example 6

A solution of calcium acetate and ethylene glycol was added to a mixture of dimethyl terephthalic acid and ethylene glycol such that the remaining concentration of calcium element was 200 ppm, and the mixture was subjected to ester exchange reaction according to usual methods, to obtain an oligomer mixture. Trimethyl phosphate was added to the oligomer mixture such that the remaining concentration of phosphorus element was 350 ppm, and stirred at 200° C. for 10 minutes in normal pressure under nitrogen atmosphere. Thereafter, the mixture of antimony trioxide and ethylene glycol solution and lithium acetate and ethylene glycol solution was added thereto such that the remaining concentration of antimony element was 200 ppm and the remaining concentration of lithium element was 100 ppm. The mixture was further stirred at 250° C. for 10 minutes in normal pressure under nitrogen atmosphere. Then, the temperature was elevated to 280° C. for 60 minutes while the reaction system was gradually decompressed to be 13.3 Pa (0.1 Torr), and polycondensed at 280° C. under a reduced pressure of 13.3 Pa, to obtain chips made of a polyester having an IV of 0.58 dL/g.

Subsequently, using a rotation-type vacuum polymerization apparatus, the chips obtained by the melt polymerization were subjected to solid phase polycondensation at 220° C. under a reduced pressure of 0.5 mmHg, to obtain chips of a solid phase polymerized polyester resin composition having an intrinsic viscosity of 0.76 dL/g and an acid value of 5 eq/ton.

Hindered phenol compounds were added during the addition of a polycondensation catalyst in Example 19. Film was produced in the same manner as in Example 1.

The results are shown in Table 5. From the results of Example 19 and Comparative Example 6, it was found that weather resistance can be further improved by introduction of hindered phenol structures in the case where the DMT method leading to excellent weather resistance and Sb/Ca/P/Li catalyst system were used.

Example 20 and Comparative Example 7

A slurry of highly pure terephtalic acid and ethylglycol was successively fed to a first reactor for esterification in which reactant was previously contained, and esterification reaction was carried out at about 250° C. and 150 kPa (0.5 kg/cm²G) for 3 hours of average retention time under stirring. The reactant was sent to a second reactor for esterification, and esterification reaction was carried out to predetermined reaction degree at about 260° C. and 106 kPa (0.05 kg/cm²G) under stirring. In addition, each of a catalyst solution in which crystalline germanium dioxide was heated and dissolved in water, ethylene glycol was added thereto and heated, and a phosphate and ethylene glycol solution was successively fed to a second reactor for esterification. Esterified reaction product was successively fed to a first reactor for polycondensation, polycondensation was carried out at about 265° C. and 3300 Pa (25 torr) for 1 hour under stirring, then at about 265° C. and 400 Pa (3 torr) for 1 hour under stirring in a second reactor for polycondensation, and at about 275° C. and 60 to 100 Pa (0.5 to 0.8 torr) for 1 hour under stirring in a final reactor for polycondensation. Melted and polycondensed reactant was formed in the chips. Obtained chips were subjected to solid phase polymerization at 220° C. under a reduced pressure of 67 Pa (0.5 torr) using a rotation-type vacuum polymerization apparatus, to obtain chips of a polyester having an IV of 0.76 dL/g and an acid value of 5 eq/ton.

The obtained Chips was dried to a moisture content of 15 ppm, and dried chips and silica particles having average particle diameter of 1.0 μm were fed into a biaxial extruder equipped with a vent, melted and kneaded under deaeration to obtain a master batch containing silica particles of 10000 ppm. The obtained chips of a solid phase polymerized polyester, a master batch containing silica particles and a master batch containing a hindered phenol compound used in Example 17 were dried to a moisture content of 17 ppm, and film formation was carried out in the same manner as in Example 4 to prepare a film. The results are shown in Table 5. It was found that the similar effects were exhibited in use of a germanium catalyst.

Example 21 and Comparative Example 8

Production of Polyester (A)

Trimellitic titanate was added to a mixture of dimethyl terephthalic acid and ethylene glycol such that the remaining concentration of titan element was 15 ppm, and the mixture was subjected to ester exchange reaction according to usual methods, to obtain an oligomer mixture. Silica particles having an average particle diameter of 1.0 μm in an amount of 800 ppm was added to the oligomer mixture. Then, the temperature was elevated to 280° C. for 60 minutes while the reaction system was gradually decompressed to be 13.3 Pa (0.1 Torr), and polycondensed at 280° C. and 13.3 Pa until the intrinsic viscosity (IV) of a polyester was 0.55 dL/g. After pressure discharge, a resin under slight pressure was discharged in form of strands in cold water to rapidly cool, thereafter kept in cooled water for 20 seconds and cut them, to obtain chips having a size of about 3 mm in length and about 2 mm in diameter, shapes of cylinder and an intrinsic viscosity (IV) of 0.55 dL/g. Obtained pellets by melted polymerization were subjected to solid phase polymerization at 220° C. under a reduced pressure of 0.5 mmHg using a rotation-type vacuum polymerization apparatus to obtain chips of a solid phase polymerized polyester (A) having an intrinsic viscosity (IV) of 0.75 dL/g and an acid value of 6 eq/ton.

Production of Polyester (B)

Dimethyl terephthalic acid and ethylene glycol were used as start raw materials and germanium dioxide was used as a catalyst, to obtain a polyester (B) containing orthophosphate of 1000 ppm and having an IV of 0.75 dL/g and an acid value of 6 eq/ton In Example 21, polyester (A), polyester (B) and a master batch containing a hindered phenol compound used in Example 17 were dried to a moisture content of 17 ppm. Film was formed in the same manner as in Example 4 to produce a film.

In Comparative Example 8, film was produced in the same manner as in Example 21 except that a master batch containing a hindered phenol compound was not used.

The results are shown in Table 5. From the results of Example 21 and Comparative Example 8, it was confirmed that effects were exhibited in the case where titan was used as a catalyst.

TABLE 5

| | Example 19 | Comparative Example 6 | Example 20 | Comparative Example 7 | Example 21 | Comparative Example 8 |
|---|---|---|---|---|---|---|
| Hindered phenol compound | IRG1330 | — | IRG1010 | — | IRG1010 | — |
| Content of Hindered phenol compound (ppm) | 200 | 0 | 200 | 0 | 200 | 0 |
| Content of Hindered phenol structure (eq/ton) | 0.77 | 0 | 0.68 | 0 | 0.68 | 0 |
| Content of DEG (mol % in glycol) | 1.2 | 1.2 | 1.2 | 1.2 | 1.3 | 1.3 |
| IV of film (dL/g) | 0.71 | 0.69 | 0.73 | 0.7 | 0.71 | 0.68 |
| IV of raw material PET (dL/g) | 0.76 | 0.76 | 0.76 | 0.76 | 0.75 | 0.75 |
| AV of film (eq/ton) | 7 | 10 | 8 | 12 | 10 | 13 |
| AV of raw material PET (eq/ton) | 5 | 5 | 5 | 5 | 6 | 6 |
| Content of CT in film (% by mass) | 0.4 | 0.4 | 0.4 | 0.4 | 0.35 | 0 |
| Kind of Catalyst | Sb/Ca/Li/P | Sb/Ca/Li/P | Ge | Ge | Ti | Ti |
| TOD | 0.01 | 0.23 | 0.02 | 0.45 | 0 | 0 |
| Polyester in resin | 100 | 100 | 100 | 100 | 100 | 100 |
| Result of HAST test (105° C., 300 hr, %) | 95 | 65 | 90 | 55 | 65 | 40 |
| Fracture elongation retention half life at 160° C. (hr) | 1100 | 600 | 1000 | 600 | 800 | 500 |
| Contamination of die lip, roll and the like | A | A | A | A | A | A |

IRG1330: Irganox 1330, manufactured by BASF Japan Ltd.
IRG1010: Irganox 1010, manufactured by BASF Japan Ltd.

Example 22

Preparation of Master Batch Containing Fine Particles

Chips of the solid phase polymerized polyester resin composition used in Example 2 were dried to a moisture content of 17 ppm. The chips of 50% by mass were mixed with rutile titanium dioxide of 50% by mass having an average particle diameter of 0.3 μm (electron microscopy method). The mixture was fed to a biaxial extrude equipped with a vent, kneaded with deaeration, and extruded at 275° C. to prepare a master batch containing fine particles of rutile titanium dioxide (MB-1).
(Preparation of Void Forming Agent)

As raw materials, 20% by mass of polystyrene having melt flow rate of 1.5 (G797N manufactured by Japan PolyStyrene Inc), 20% by mass of polypropylene polymerized in gas and having melt flow rate of 3.0 (F300SP, manufactured by Idemitsu Kosan Co., Ltd) and 60% by mass of polymethylpentene having melt flow rate of 180 (TPX DX-820 manufactured by Mitsui Chemicals Inc) were mixed in form of pellets, fed to a biaxial extruder, and sufficiently kneaded, to prepare a void forming agent (MB-II).

Chips of a solid phase polymerized polyester resin composition used in Example 2, MB-I and MB-II were mixed so as to be 80:12:8 (% by mass). The mixture was dried to a moisture content of 18 ppm, fed to an extruder, mixed and kneaded at 280° C., and extruded on a cooled drum controlled to 30° C. using T-die, to produce a non-drawn sheet. Next, the obtained non-drawn sheet was uniformly heated to 70° C. with heated rolls, and thereafter drawn at a ratio of 3.3 at 90° C. Subsequently, the obtained uniaxially drawn film was sent to a tenter, drawn at a ratio of 3.7 in a width direction at 140° C., heat-set at 220° C. for 5 seconds with width fixation, and further subjected to a relaxation treatment of 4% at 220° C. in the width direction, to obtain a void-containing white film having a thickness of 188 μm.

Example 23

A master batch containing fine particles (MB-III) was prepared in the same manner as in Example 22 except that a solid phase polymerized polyester resin composition was changed to a solid phase polymerized polyester resin composition obtained in Example 3.

A void-containing white film was obtained in the same manner as in Example 22 except that chips of a solid phase polymerized polyester resin composition was changed to those obtained in Example 3 and a master batch containing fine particles (MB-I) was changed to (MB-III).

Comparative Example 9

A master batch containing fine particles (MB-IV) was prepared in the same manner as in Example 22 except that a solid phase polymerized polyester resin composition was changed to chips of a solid phase polymerized polyester resin composition (without containing a hindered phenol compound) manufactured in Examples 4 to 10.

A void-containing white film was obtained in the same manner as in Example 22 except that chips of a solid phase polymerized polyester resin composition was changed to those manufactured in Examples 4 to 10 and a master batch containing fine particles (MB-I) was changed to (MB-IV).

Example 24

A white film was obtained in the same manner as in Example 22, except that 70% by mass of chips of a solid phase polymerized polyester resin composition obtained in Example 3 and 30% by mass of MB-III were used.

Example 25

A raw material of (A) layer was prepared by mixing 50% by mass of chips of a polyester resin composition obtained Example 3 and 50% by mass of MB-III. A raw material composition of film of Example 23 was used as a raw material of (B) layer. Each of raw materials of (A) layer and (B) layer was fed to separative extruders, mixed and melted at 280° C., subsequently B layer in the melting state was joined on one side of A layer using a feedblock. At this time, delivery ratio of A layer and B layer was controlled using a gear pump. Then, layers were extruded on a cooled drum controlled at 30° C. using T-die, to prepare a non-drawn sheet so as to be A/B/A layers.
(Production of Biaxially Drawn Film)

The obtained non-drawn sheet was uniformly heated to 70° C. with heated rolls, and thereafter drawn at a ratio of 3.3 at 90° C. with rolls. Subsequently, the obtained uniaxially drawn film was sent to a tenter, drawn at a ratio of 3.7 in a width direction at 140° C., heat-set at 220° C. for 5 seconds with width fixation, and further subjected to a relaxation treatment of 4% at 220° C. in the width direction, to obtain a void-containing white film having a thickness of 188 μm (19/150/19).

The results of Examples 22 to 25 and Comparative Example 9 are shown in Table 6.

was sent to a tenter, drawn at a ratio of 3.7 in a width direction at 140° C., heat-set at 220° C. for 5 seconds with width fixation, and further subjected to a relaxation treatment of 4% at 220° C. in the width direction to obtain a film having a thickness of 50 μm (5/40/5).

The results of weather resistance test (105° C., 300 hours) were 85% and good, but the film was whitened perhaps because crack was occurred on the surface from the beginning of elongation and appearance was poor.

Reference Example 2

Film was obtained in the same as in Reference Example 1 except that raw materials of A layer and B layer were changed from Reference Example 1.

The results of weather resistance test (105° C., 300 hours) were 55%, leading to poor weather resistance. This reason is because the main core layer of the film was poor in weather resistance and elongation cannot be realized by only a thin surface layer.

From the results, polyester films of Examples shows more higher hydrolysis-resistance than that of a hydrolysis-resistance polyester film having conventionally low AV and high IV (for example, Comparative Examples 3 and 6).

TABLE 6

|  | Example 22 | Example 23 | Example 24 | Example 25 | Comparative Example 9 |
|---|---|---|---|---|---|
| Hindered phenol compound | IRG1330 | IRG1330 | IRG1330 | IRG1330 | — |
| Content of Hindered phenol compound (ppm) | 100 | 200 | 200 | 200 | 0 |
| Content of Hindered phenol structure (eq/ton) | 0.39 | 0.77 | 0.77 | 0.77 | 0 |
| Content of DEG (mol % in glycol) | 1.2 | 1.2 | 1.2 | 1.2 | 1.2 |
| IV of film (dL/g) | 0.71 | 0.71 | 0.71 | 0.71 | 0.67 |
| IV of raw material PET (dL/g) | 0.76 | 0.76 | 0.76 | 0.76 | 0.76 |
| AV of film (eq/ton) | 20 | 17 | 17 | 17 | 27 |
| AV of raw material PET (eq/ton) | 5 | 5 | 5 | 5 | 5 |
| Content of CT in film (% by mass) | 0.45 | 0.45 | 0.45 | 0.45 | 0.45 |
| Kind of Catalyst | Sb | Sb | Sb | Sb | Sb |
| Result of HAST test (105° C., 200 hr, %) | 75 | 80 | 78 | 80 | 55 |
| Apparent specific gravity | 1.1 | 1.08 | — | 1.13 | 1.1 |
| Whiteness degree | 86 | 87 | 91 | 92 | 86 |

Reference Example 1

Chips of a polyester resin composition (without containing a hindered phenol compound) manufactured in Examples 4 to 10 were used as a raw material of A layer. Compositions of film raw material used in Example 7 were used as a raw material of B layer. Each of these raw materials of A layer and B layer was fed to separative extruders, mixed and melted at 280° C., subsequently B layer in melting state was joined on one side of A layer using a feedblock. At this time, delivery ratio of A layer and B layer was controlled using a gear pump. Then, layers were extruded on a cooled drum controlled at 30° C. using T-die, to prepare a non-drawn sheet so as to be A/B/A layers.
(Production of Biaxially Drawn Film)

The obtained non-drawn sheet was uniformly heated to 70° C. with heated rolls, and thereafter drawn at a ratio of 3.3 at 90° C. with rolls. Subsequently, the uniaxially drawn film (Production of homoPET)

Magnesium acetate tetrahydrate was added to a mixture of terephthalic acid and ethylene glycol such that the concentration in a polyester was 120 ppm in terms of a Mg atom, and the mixture was reacted at a temperature of 255° C. at normal pressure. Thereafter, thereto were further added antimony trioxide in such an amount that the concentration in the polyester was 250 ppm in terms of an Sb atom, cobalt acetate tetrahydrate in such an amount that the concentration in the polyester was 30 ppm in terms of a Co atom and trimethyl phosphate in an such an amount that the concentration in the polyester was 150 ppm in terms of a P atom, and the mixture was further reacted at a temperature of 260° C.

Subsequently, the reaction product was transferred to a polycondensation reaction reactor, and silica particles having an average particle diameter of 1.0 μm were added such that the concentration in the polyester was 800 ppm. Then, the reaction system was gradually decompressed while elevating the temperature by heating, and polymerized at 290° C. under a reduced pressure of 133 Pa (1 mmHg) according to usual methods, to obtain chips having an IV of 0.60 dL/g. Subsequently, using a rotation-type vacuum polymerization apparatus, solid phase polycondensation was conducted at 220° C. under a reduced pressure of 67 Pa (0.5 mmHg) to obtain a resin composition having an intrinsic viscosity of 0.76 dL/g and an acid value of 5 eq/ton. The content of a cyclic trimer (CT) was 0.29% by mass.

(Production of Master Batch 1 Containing Hindered Phenol Compound)

Chips of the homoPET were dried to a moisture content of 15 ppm, the chips and hindered phenol compound (Irganox (registered trademark) 1330) were fed into a biaxial extruder, decompressed with a vent, and melted and kneaded, to obtain a master batch 1 containing a hindered phenol compound of 50000 ppm.

Examples 26 to 29 and Comparative Examples 10 and 11

A polyester resin composition was obtained by copolymerizing 3 mol % of neopentyl glycol (NPG) according to the manufacture of homoPET. A polyester resin composition had an intrinsic viscosity of 0.76 dL/g and an acid value of 5 eq/ton.

Obtained chips of a polyester resin composition and a master batch 1 containing a hindered phenol compound were dry-blended. The mixture was dried to a moisture content of 17 ppm, fed to an extruder, and extruded in a sheet form from a die while the resin maximum temperature in an extruder melting part, a kneading part, a polymer tube, a gear pump and a filter was set at 290° C. and the resin maximum temperature in subsequent polymer tubes was set at 285° C. These polymers were each filtered using a filter medium of a stainless sintered body (nominal filtration accuracy: 20 μm particle 95% cut). A flat die was set such that the resin temperature was 285° C. The extruded resin was wound around a casting drum having a surface temperature of 30° C., and solidified by cooling to prepare a non-drawn film.

Next, the non-drawn film was heated to 100° C. with a group of heated rolls and an infrared heater, and thereafter drawn at a ratio of 3.3 in a longer direction by a group of rolls having a difference in circumferential speed, so that a uniaxially oriented PET film was obtained. Subsequently, the uniaxially oriented PET film was drawn at a ratio of 4.0 in a width direction at 130° C. in a tenter, heat-set at 235° C., and further subjected to a relaxation treatment at 200° C. in the width direction to obtain a biaxially oriented PET film having a thickness of 50 μm.

The results are shown in Table 7.

Comparative Example 12

A polyester resin composition was obtained by copolymerizing 3 mol % of neopentyl glycol according to the manufacture of homoPET. A polyester film was produced in the same manner as in Example 26 using only the polyester resin composition, but the temperature was controlled such that the pressure of a polyester resin in each of film formation steps was comparable to that of Example 28. Specifically, the resin maximum temperature in an extruder melting part, a kneading part, a polymer tube, a gear pump and a filter was set at 300° C. and the resin maximum temperature in subsequent polymer tubes was set at 290° C.

The results are shown in table 7. Although the intrinsic viscosity of film was the same as those of Examples, high temperature was required in film formation step since it was necessary to increase the intrinsic viscosity of a raw material polyester. As a result, decomposition was processed, and the acid value of the film was increased, leading to poor weather resistance.

TABLE 7

|  | Example 26 | Example 27 | Example 28 | Example 29 | Comparative Example 10 | Comparative Example 11 | Comparative Example 12 |
|---|---|---|---|---|---|---|---|
| Copolymer component | NPG | NPG | NPG | NPG | NPG | NPG | NPG |
| (mol %) | 3 | 3 | 3 | 3 | 3 | 3 | 3 |
| Hindered phenol compound | IRG1330 | IRG1330 | IRG1330 | IRG1330 | IRG1330 | IRG1330 | — |
| Content of Hindered phenol compound (ppm) | 30 | 60 | 200 | 400 | 5 | 2200 | 0 |
| Content of Hindered phenol structure (eq/ton) | 0.12 | 0.23 | 0.77 | 1.55 | 0.02 | 8.51 | 0 |
| Content of DEG (mol % in glycol) | 1.2 | 1.2 | 1.2 | 1.2 | 1.2 | 1.2 | 1.2 |
| IV of film (dL/g) | 0.72 | 0.73 | 0.73 | 0.73 | 0.69 | 0.73 | 0.73 |
| IV of raw material PET (dL/g) | 0.76 | 0.76 | 0.76 | 0.76 | 0.76 | 0.76 | 0.81 |
| AV of film (eq/ton) | 8 | 8 | 8 | 8 | 13 | 8 | 17 |
| AV of raw material PET (eq/ton) | 5 | 5 | 5 | 5 | 5 | 5 | 4 |
| Content of CT in film (% by mass) | 0.4 | 0.4 | 0.4 | 0.4 | 0.4 | 0.4 | 0.4 |
| TOD | 0.1 | 0.01 | 0.01 | 0.01 | 0.3 | 0.01 | 0.4 |
| Result of HAST test (105° C., 300 hr, %) | 87 | 91 | 91 | 93 | 61 | 92 | 60 |
| Fracture elongation retention half life at 160° C. (hr) | 900 | 1000 | 1100 | 1100 | 600 | 1000 | 600 |
| Contamination of die lip, roll and the like | A | A | A | A | A | B | A |

TABLE 7-continued

|  | Example 26 | Example 27 | Example 28 | Example 29 | Comparative Example 10 | Comparative Example 11 | Comparative Example 12 |
|---|---|---|---|---|---|---|---|
| Thermal shrinkage coefficient (%) 150° C. 30 min | 2 | 2 | 2 | 2 | 2 | 2 | 2 |

IRG1330: Irganox 1330, manufactured by BASF Japan Ltd.

Example 30

A polyester resin composition was obtained by copolymerizing 3 mol % of isophthalic acid (IPA) according to the manufacture of homoPET. A polyester film was produced in the same manner as in Example 28 using chips of the polyester resin composition obtained and a master batch 1 containing a hindered phenol compound. The results are shown in Table 8.

Example 31

A polyester resin composition was obtained by copolymerizing 3 mol % of 1,4-cyclohexane dimethanol (CHDM) according to the manufacture of homoPET. A polyester film was produced in the same manner as in Example 28 using chips of the polyester resin composition obtained and a master batch 1 containing a hindered phenol compound. The results are shown in Table 8.

Example 32

A polyester film was prepared in the same manner as in Example 28 after homoPET, polyethylene naphthalate (IV=6.5 dL/g, AV=6) and a master batch 1 containing a hindered phenol compound were dry-blended. The results are shown in Table 8. Incidentally, NDC represents naphthalene dicarboxylic acid component.

Examples 33 to 35

A polyester resin composition was obtained by copolymerizing each of 1.5 mol %, 5 mol % and 10 mol % of neopentyl glycol according to the manufacture of homoPET. The polyester resin composition obtained was dry-blended with a master batch 1 containing a hindered phenol compound, to prepare a polyester film in the same manner as in Example 28. Incidentally, in Example 35, the temperature was 225° C. for prevention of clip attachment during heat set. The results are shown in Table 8.

TABLE 8

|  | Example 30 | Example 31 | Example 32 | Example 33 | Example 34 | Example 35 |
|---|---|---|---|---|---|---|
| Copolymer component | IPA | CHDM | NDC | NPG | NPG | NPG |
| (mol %) | 3 | 3 | 3 | 1.5 | 5 | 10 |
| Hindered phenol compound | IRG1330 | IRG1330 | IRG1330 | IRG1330 | IRG1330 | IRG1330 |
| Content of Hindered phenol compound (ppm) | 200 | 200 | 200 | 200 | 200 | 200 |
| Content of Hindered phenol structure (eq/ton) | 0.77 | 0.77 | 0.77 | 0.77 | 0.77 | 0.77 |
| Content of DEG (mol % in glycol) | 1.2 | 1.2 | 1.2 | 1.2 | 1.2 | 1.2 |
| IV of film (dL/g) | 0.73 | 0.73 | 0.73 | 0.73 | 0.72 | 0.72 |
| IV of raw material PET (dL/g) | 0.76 | 0.76 | 0.76 | 0.76 | 0.76 | 0.76 |
| AV of film (eq/ton) | 8 | 8 | 8 | 8 | 8 | 8 |
| AV of raw material PET (eq/ton) | 5 | 5 | 5 | 5 | 5 | 5 |
| Content of CT in film (% by mass) | 0.4 | 0.4 | 0.4 | 0.4 | 0.4 | 0.4 |
| TOD | 0.01 | 0.01 | 0.01 | 0.01 | 0.01 | 0.01 |
| Result of HAST test (105° C., 300 hr, %) | 91 | 90 | 92 | 89 | 91 | 91 |
| Fracture elongation retention half life at 160° C. (hr) | 1100 | 1100 | 1100 | 900 | 1000 | 1000 |
| Contamination of die lip, roll and the like | A | A | A | A | A | A |
| Thermal shrinkage coefficient (%) 150° C. 30 min | 2 | 2 | 2 | 2 | 2.4 | 5 |

IRG1330: Irganox 1330, manufactured by BASF Japan Ltd.

Example 36

Chips of the homoPET were dried to a moisture content of 15 ppm, the chips and hindered phenol compound (Irganox® 1010) were fed into a biaxial extruder, decompressed with a vent, and melted and kneaded, to obtain a master batch containing a hindered phenol compound of 50000 ppm (master batch 2 containing a hindered phenol compound).

A polyester film was prepared in the same manner as in Example 28 except that a master batch 2 containing a hindered phenol compound was used as a master batch.

Example 37

A polyester resin composition was obtained by copolymerizing 3 mol % of neopentyl glycol according to the manufacture of homoPET. The polyester resin composition had an IV of 0.70 dL/g and an acid value of 6 eq/ton. A polyester film was produced in the same manner as in Example 3 using chips of the polyester resin composition obtained and a master batch 1 containing a hindered phenol compound, but the temperature was controlled such that the pressure of a polyester resin in each of film formation steps was comparable to that of Example 3. Specifically, the resin maximum temperature in an extruder melting part, a kneading part, a polymer tube, a gear pump and a filter was set at 288° C. and the resin maximum temperature in subsequent polymer tubes was set at 285° C. The results are shown in Table 9. Weather resistance was inferior to that of Example 28 due to low molecular weight but results were good level.

Comparative Example 13

A polyester resin composition was obtained by copolymerizing 3 mol % of neopentyl glycol according to the manufacture of homoPET. The polyester resin composition had an IV of 0.64 dL/g and an acid value of 5 eq/ton. A polyester film was produced in the same manner as in Example 37 using chips of the polyester resin composition obtained and a master batch 1 containing a hindered phenol compound. The results are shown in Table 9. Weather resistance was poor due to low molecular weight.

Comparative Example 14

A polyester resin composition was obtained by copolymerizing 3 mol % of neopentyl glycol according to the manufacture of homoPET. The polyester resin composition had an IV of 0.76 dL/g and an acid value of 23 eq/ton. A polyester film was produced in the same manner as in Example 28 using chips of the polyester resin composition obtained and master batch 1 containing a hindered phenol compound. The results are shown in Table 9. Weather resistance was poor due to high acid value.

Example 38

Magnesium acetate tetrahydrate was added into a mixture of terephthalic acid, ethylene glycol and neopentyl glycol such that the concentration in a polyester was 120 ppm in terms of a Mg atom, and the mixture was reacted at a temperature of 255° C. at normal pressure. Thereafter, thereto were further added antimony trioxide in such an amount that the concentration in the polyester was 250 ppm in terms of an Sb atom, cobalt acetate tetrahydrate in such an amount that the concentration in the polyester was 30 ppm in terms of a Co atom and trimethyl phosphate in an such an amount that the concentration in the polyester was 150 ppm in terms of a P atom, and the mixture was further reacted at a temperature of 260° C.

Subsequently, the reaction product was transferred to a polycondensation reaction reactor, and hindered phenol compound (Irganox 1330) was added such that the concentration in the polyester was 200 ppm and silica particles having an average particle diameter of 1.0 μm were added such that the concentration in the polyester was 800 ppm. Then, the reaction system was gradually decompressed while elevating the temperature by heating, and polymerized at 290° C. under a reduced pressure of 133 Pa (1 mmHg) according to usual methods, to obtain chips having an IV of 0.60 dL/g. Subsequently, using a rotation-type vacuum polymerization apparatus, solid phase polycondensation was conducted at 220° C. under a reduced pressure of 67 Pa (0.5 mmHg) to obtain a resin composition having an intrinsic viscosity of 0.76 dL/g and an acid value of 5 eq/ton. The content of a cyclic trimer (CT) was 0.3% by mass.

Chips of a polyester resin composition obtained were dried to a moisture content of 17 ppm, to prepare a polyester film in the same manner as in Example 26. The results are shown in Table 9. Film having high weather resistance was obtained even when a hindered phenol compound was added during polycondensation of a polyester.

Example 39

A solution of calcium acetate and ethylene glycol was added into a mixture of dimethyl terephthalate, dimethyl isophthalate and ethylene glycol such that the remaining concentration of calcium element was 200 ppm, and the mixture was subjected to ester exchange reaction according to usual methods, to obtain an oligomer mixture. Trimethyl phosphate was added to the oligomer mixture such that the remaining concentration of phosphorus element was 350 ppm, and stirred at 200° C. for 10 minutes in normal pressure under nitrogen atmosphere. Thereafter, the mixture of antimony trioxide and ethylene glycol solution, and lithium acetate and ethylene glycol solution was added thereto such that the remaining concentration of antimony element was 200 ppm and the remaining concentration of lithium element was 100 ppm. The mixture was further stirred at 250° C. for 10 minutes in normal pressure under nitrogen atmosphere. Then, the temperature was elevated to 280° C. for 60 minutes while the reaction system was gradually decompressed to be 13.3 Pa (0.1 Torr), and polycondensed at 280° C. under 13.3 Pa, to obtain chips made of a polyester having an IV of 0.58 dL/g.

Subsequently, using a rotation-type vacuum polymerization apparatus, the chips obtained by the melt polymerization were subjected to solid phase polycondensation at 220° C. under a reduced pressure of 0.5 mmHg, to obtain chips of a copolymerized polyester resin composition having an intrinsic viscosity of 0.76 dL/g and an acid value of 5 eq/ton.

A polyester film was prepared in the same manner as in Example 28 using chips of obtained polyester resin composition and a master batch 1 containing a hindered phenol compound. The results are shown in Table 9.

TABLE 9

|  | Example 36 | Example 37 | Comparative Example 13 | Comparative Example 14 | Example 38 | Example 39 |
|---|---|---|---|---|---|---|
| Copolymer component | NPG | NPG | NPG | NPG | NPG | IPA |
| (mol %) | 3 | 3 | 3 | 3 | 3 | 3 |
| Hindered phenol compound | IRG1010 | IRG1330 | IRG1330 | IRG1330 | IRG1330 | IRG1330 |
| Content of Hindered phenol compound (ppm) | 200 | 200 | 200 | 200 | 200 | 200 |
| Content of Hindered phenol structure (eq/ton) | 0.68 | 0.77 | 0.77 | 0.77 | 0.77 | 0.77 |
| Content of DEG (mol % in glycol) | 1.2 | 1.2 | 1.2 | 1.2 | 1.2 | 1.2 |
| IV of film (dL/g) | 0.73 | 0.68 | 0.62 | 0.73 | 0.73 | 0.73 |
| IV of raw material PET (dL/g) | 0.76 | 0.7 | 0.64 | 0.76 | 0.76 | 0.76 |
| AV of film (eq/ton) | 8 | 8 | 7 | 27 | 8 | 7 |
| AV of raw material PET (eq/ton) | 5 | 6 | 5 | 23 | 5 | 5 |
| Content of CT in film (% by mass) | 0.4 | 0.4 | 0.4 | 0.9 | 0.4 | 0.4 |
| TOD | 0.01 | 0.01 | 0.01 | 0.01 | 0.01 | 0.01 |
| Result of HAST test (105° C., 300 hr, %) | 92 | 87 | 55 | 20 | 91 | 92 |
| Fracture elongation retention half life at 160° C. (hr) | 1100 | 1000 | 600 | 700 | 1000 | 1100 |
| Contamination of die lip, roll and the like | A | A | A | A | A | A |
| Thermal shrinkage coefficient (%) 150° C. 30 min | 2 | 2 | 2 | 2 | 2 | 2 |

IRG1010: Irganox 1010, manufactured by BASF Japan Ltd.
IRG1330: Irganox 1330, manufactured by BASF Japan Ltd.

Example 40

Production of Master Batch Containing Fine Particles

Chips of the copolymerized polyester resin composition used in Example 28 were dried to a moisture content of 17 ppm. The chips of 49.6% by mass and a master batch containing a hindered phenol compound of 0.4% by mass were mixed with rutile titanium dioxide of 50% by mass having an average particle diameter of 0.3 µm (electron microscopy method). The mixture was fed to a biaxial extrude equipped with a vent, kneaded with deaeration, and extruded at 275° C., to prepare a master batch containing fine particles of rutile titanium dioxide (MB-IV).
(Preparation of Void Forming Agent)
As raw materials, 20% by mass of polystyrene having melt flow rate of 1.5 (G797N manufactured by Japan Poly-Styrene Inc), 20% by mass of polypropylene polymerized in gas and having melt flow rate of 3.0 (F300SP, manufactured by Idemitsu Kosan Co., Ltd) and 60% by mass of polymethylpentene having melt flow rate of 180 (TPX DX-820 manufactured by Mitsui Chemicals Inc) were mixed in form of pellets, fed to a biaxial extruder, and sufficiently kneaded, to prepare a void forming agent (MB-V).
Chips of the solid phase polymerized polyester resin composition used in Example 28, a master batch 1 containing a hindered phenol compound, MB-IV and MB-V were mixed so as to be 80:0.32:12:8 (mass ratio). The mixture was dried to a moisture content of 18 ppm, fed to an extruder, mixed and kneaded at 280° C., and extruded on a cooled drum controlled to 30° C. using T-die to produce a non-drawn sheet. Next, the obtained non-drawn sheet was uniformly heated to 70° C. with heated rolls, and thereafter drawn at a ratio of 3.3 at 90° C. Subsequently, the uniaxially drawn film was sent to a tenter, drawn at a ratio of 3.7 in a width direction at 140° C., heat-set at 220° C. for 5 seconds with width fixation, and further subjected to a relaxation treatment of 4% at 220° C. in the width direction to obtain a void-containing white film having a thickness of 188 µm. The results are shown in Table 10.

Comparative Example 15

A void-containing white film was obtained in the same manner as in Example 40 except that a master batch 1 containing a hindered phenol compound was not added during production of a master batch containing fine particles and film formation. The results are shown in Table 10.

Example 41

Chips of the solid phase polymerized polyester resin composition used in Example 28, a master batch 1 containing a hindered phenol compound and MB-IV were mixed so as to be 70:0.28:30 (mass ratio). The mixture was dried to a moisture content of 18 ppm, fed to an extruder, mixed and kneaded at 280° C., and extruded on a cooled drum controlled to 30° C. using T-die, to produce a non-drawn sheet. Next, the obtained non-drawn sheet was uniformly heated to 70° C. with heated rolls, and thereafter drawn at a ratio of 3.3 at 90° C. Subsequently, the uniaxially drawn film was sent to a tenter, drawn at a ratio of 3.7 in a width direction at 140° C., heat-set at 220° C. for 5 seconds with width fixation, and further subjected to a relaxation treatment of 4% at 220° C. in the width direction, to obtain a white film having a thickness of 188 µm. The results are shown in Table 10.

TABLE 10

| | Example 40 | Comparative Example 15 | Example 41 |
|---|---|---|---|
| Copolymer component (mol %) | NPG 3 | NPG 3 | NPG 3 |
| Hindered phenol compound | IRG1330 | — | IRG1330 |
| Content of Hindered phenol compound (ppm) | 200 | 0 | 200 |
| Content of Hindered phenol structure (eq/ton) | 0.77 | 0 | 0.77 |
| Content of DEG (mol % in glycol) | 1.2 | 1.2 | 1.2 |
| IV of film (dL/g) | 0.71 | 0.66 | 0.71 |
| IV of raw material PET (dL/g) | 0.76 | 0.76 | 0.76 |
| AV of film (eq/ton) | 17 | 28 | 16 |
| AV of raw material PET (eq/ton) | 5 | 5 | 5 |
| Content of CT in film (% by mass) | 0.45 | 0.45 | 0.45 |
| Result of HAST test (105° C., 200 hr, %) | 80 | 53 | 79 |
| Apparent specific gravity | 1.11 | — | 1.1 |
| Whiteness degree | 90 | 90 | 88 |

IRG1330: Irganox 1330, manufactured by BASF Japan Ltd.

When the polyester film is used for the back sheet of the solar cell, a film of Examples is bonded and laminated with, a barrier film, electric insulation film, a light reflection layer and the like as necessary to form a back sheet. The solar cell back sheet obtained can be formed into a solar cell module by packing an electromotive cell of crystalline silicon, amorphous silicon or the like between the sheet and a surface base material such as glass or the like via a filler such as EVA or the like. The obtained solar cell can accomplish much high durability.

INDUSTRIAL APPLICABILITY

The polyester film of the present invention has high weather resistance, and can be used in various applications that require weather resistance, particularly hydrolysis resistance. Examples of specific applications include those of a front sheet (light receiving surface) and back sheet (opposite to the light receiving surface) of a solar cell, motor insulation, and a capacitor, and particularly the polyester film is suitably used for the back sheet of the solar cell.

The invention claimed is:

1. A hydrolysis-resistant polyester film comprising a polyester resin composition, wherein
the polyester resin composition that forms the film contains 0.03 to 6.7 eq/ton of hindered phenol structural units,
an acid value of a polyester that forms the film is less than 25 eq/ton,
an intrinsic viscosity of a polyester that forms the film is more than 0.64 dL/g and not more than 0.90 dL/g, and
the polyester is polymerized using a polymerization catalyst comprising an antimony compound in combination with a calcium compound, a lithium compound, and a phosphorus compound,
the polyester resin comprises Sb atoms in an amount of from 70 ppm to 400 ppm, Ca atoms in an amount of from 50 ppm to 400 ppm, Li atoms are present in an amount of from 20 ppm to 300 ppm, and P atoms in an amount of from 100 ppm to 1,000 ppm, and
the polyester resin composition does not substantially contain a compound having a substituent reactive with an OH group or a carboxyl group, except an OH group and a carboxyl group.

2. The hydrolysis-resistant polyester film according to claim 1, wherein the polyester comprises terephthalic acid and/or naphthalenedicarboxylic acid as acid components,
the total content of the terephthalic acid and naphthalenedicarboxylic acid is not less than 90 mol % based on total acid components,
the polyester comprises ethylene glycol and/or diethylene glycol as glycol components, and
the total content of the ethylene glycol and diethylene glycol is not less than 90 mol % based on total glycol components.

3. The hydrolysis-resistant polyester film according to claim 1, wherein the polyester is homo-polyethylene terephthalate or homo-polyethylene naphthalate.

4. The hydrolysis-resistant polyester film according to claim 1, wherein the polyester is a copolymer having ethylene terephthalate as a main constituent,
the content of acid components other than terephthalic acid is not more than 7 mol % based on total acid components, and/or
the content of glycol components other than ethylene glycol is not more than 7 mol % based on total glycol components.

5. The hydrolysis-resistant polyester film according to claim 4, wherein in the polyester, the total content of acid components other than terephthalic acid and glycol components other than ethylene glycol, which form the polyester, is not more than 7 mol % based on the sum of total acid components and total glycol components.

6. The hydrolysis-resistant polyester film according to claim 1, wherein the polyester content in the polyester resin composition is more than 90% by mass.

7. The hydrolysis-resistant polyester film according to claim 1, wherein the thermal-oxidative decomposition resistance parameter (TOD) of the polyester resin composition that forms the film is not more than 0.25.

8. The hydrolysis-resistant polyester film according to claim 1, wherein the apparent specific gravity of the film is 0.7 to 1.3.

9. The hydrolysis-resistant polyester film according to claim 1, wherein the polyester resin composition contains a hindered phenol compound in an amount of not less than 10 ppm and less than 200 ppm.

10. The hydrolysis-resistant polyester film according to claim 1, wherein the hindered phenol compound is added to the polyester resin composition during film formation.

11. The hydrolysis-resistant polyester film according to claim 1, wherein the hydrolysis-resistant polyester film is for use in a solar cell back sheet, a solar cell front sheet or electrical insulation.

12. A solar cell, wherein the polyester film according to claim 1 is laminated on at least any one of a light receiving surface and a surface opposite to the light receiving surface.

13. A method of preparing the hydrolysis-resistant polyester film according to claim 1, comprising
melting in an extruder polyester chips polymerized using a polymerization catalyst,
wherein the polymerization catalyst comprises an antimony compound in combination with a calcium compound, a lithium compound, and a phosphorus compound;
forming a non-drawn film by extruding the molten resin from the extruder;
drawing the non-drawn film in at least one direction; and
heating the drawn film to obtain the polyester film.

14. The method according to claim 13, wherein the moisture content of the resin composition is not more than 100 ppm.

15. The hydrolysis-resistant polyester film according to claim 1, wherein the polyester resin composition contains less than 0.1% by mass of a compound having a substituent reactive with an OH group or a carboxyl group, except an OH group and a carboxyl group.

16. The hydrolysis-resistant polyester film according to claim 15, wherein the polyester resin composition contains less than 0.01% by mass of a compound having a substituent reactive with an OH group or a carboxyl group, except an OH group and a carboxyl group.

* * * * *